(12) United States Patent
Arutinov et al.

(10) Patent No.: US 11,476,228 B2
(45) Date of Patent: Oct. 18, 2022

(54) METHOD AND SYSTEM FOR BONDING A CHIP TO A SUBSTRATE

(71) Applicant: Nederlandse Organisatie voor toegepast-natuurwetenschappelijk onderzoek TNO, 's-Gravenhage (NL)

(72) Inventors: Gari Arutinov, Eindhoven (NL); Edsger Constant Pieter Smits, Eindhoven (NL); Jeroen van den Brand, Goirle (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 126 days.

(21) Appl. No.: 16/320,180

(22) PCT Filed: Jul. 25, 2017

(86) PCT No.: PCT/NL2017/050504
§ 371 (c)(1),
(2) Date: Jan. 24, 2019

(87) PCT Pub. No.: WO2018/021912
PCT Pub. Date: Feb. 1, 2018

(65) Prior Publication Data
US 2019/0229085 A1     Jul. 25, 2019

(30) Foreign Application Priority Data

Jul. 26, 2016 (EP) .................................... 16181184

(51) Int. Cl.
*B23K 1/00* (2006.01)
*H01L 23/00* (2006.01)
(Continued)

(52) U.S. Cl.
CPC .............. *H01L 24/81* (2013.01); *B23K 1/005* (2013.01); *B23K 1/0016* (2013.01);
(Continued)

(58) Field of Classification Search
CPC ......... H01L 24/81; H01L 24/74; H01L 24/80; H01L 21/67115; H01L 23/4985;
(Continued)

(56) References Cited

U.S. PATENT DOCUMENTS 4,337,116 A * 6/1982 Foster ................... B29C 51/162
156/212
4,446,358 A * 5/1984 Comerford .............. B23K 1/20
219/388

(Continued)

FOREIGN PATENT DOCUMENTS

JP     62101040 A * 5/1987 ............. H01L 24/81
JP     62296958 A * 12/1987
(Continued)

OTHER PUBLICATIONS

Ende et al. "Large Area Photonic Flash Soldering of Thin Chips on Flex Foils for Flexible Electronic Systems: In Situ Temperature Measurements and Thermal Modelling" pp. 1175-1183; Aug. 11, 2014.*

(Continued)

*Primary Examiner* — Kiley S Stoner
(74) *Attorney, Agent, or Firm* — Leydig, Voit & Mayer, Ltd.

(57) ABSTRACT

A method and system for heat bonding a chip to a substrate by means of heat bonding material disposed there between. At least the substrate is preheated from an initial temperature to an elevated temperature below a damage temperature of the substrate. A light pulse applied to the chip momentarily increases the chip temperature to a pulsed peak temperature (Continued)

below a peak damage temperature of the chip. The momentarily increased pulsed peak temperature of the chip causes a flow of conducted heat from the chip to the bonding material, causing the bonding material to form a bond.

11 Claims, 13 Drawing Sheets

(51) Int. Cl.
*H05K 3/34* (2006.01)
*B23K 1/005* (2006.01)
*B23K 1/20* (2006.01)
*H01L 21/67* (2006.01)
*H01L 23/498* (2006.01)
*H01L 33/62* (2010.01)
*B23K 101/42* (2006.01)

(52) U.S. Cl.
CPC .............. *B23K 1/0053* (2013.01); *B23K 1/20* (2013.01); *H01L 21/67115* (2013.01); *H01L 23/4985* (2013.01); *H01L 24/74* (2013.01); *H01L 24/75* (2013.01); *H01L 24/80* (2013.01); *H01L 33/62* (2013.01); *H05K 3/3494* (2013.01); *B23K 2101/42* (2018.08); *H01L 2224/133* (2013.01); *H01L 2224/16227* (2013.01); *H01L 2224/75* (2013.01); *H01L 2224/7525* (2013.01); *H01L 2224/75251* (2013.01); *H01L 2224/75262* (2013.01); *H01L 2224/75651* (2013.01); *H01L 2224/75901* (2013.01); *H01L 2224/81* (2013.01); *H01L 2224/8122* (2013.01); *H01L 2224/81048* (2013.01); *H01L 2224/81192* (2013.01); *H01L 2224/81815* (2013.01); *H01L 2224/95115* (2013.01); *H01L 2924/12041* (2013.01); *H01L 2924/14* (2013.01); *H01L 2933/0066* (2013.01); *H05K 2201/10674* (2013.01); *H05K 2203/1545* (2013.01)

(58) Field of Classification Search
CPC ..... H01L 24/75; H01L 33/62; H01L 2224/81; H01L 2224/75251; H01L 2224/81192; H01L 2224/75; H01L 2224/95115; H01L 2224/75262; H01L 2224/75651; H01L 2224/75901; H01L 2224/133; H01L 2224/16227; H01L 2224/7525; H01L 2224/81048; H01L 2224/8122; H01L 2224/81815; H01L 2924/12041; H01L 2924/14; H01L 2933/0066; H01L 2224/131; H01L 24/14; H01L 24/741; B23K 1/0016; B23K 1/005; B23K 1/0053; B23K 1/20; B23K 2101/42; H05K 3/3494; H05K 2201/10674; H05K 2203/1545
USPC .......................................... 219/121.6–121.65
See application file for complete search history.

(56) References Cited

U.S. PATENT DOCUMENTS

| | | | | |
|---|---|---|---|---|
| 5,627,081 A * | 5/1997 | Tsuo | .................. | H01L 31/1804 438/57 |
| 5,647,122 A * | 7/1997 | Launay | ............ | G06K 19/07743 29/840 |
| 5,740,313 A * | 4/1998 | Ueda | ...................... | B23K 1/005 219/497 |
| 5,850,690 A * | 12/1998 | Launay | ............ | G06K 19/07743 29/841 |
| 5,899,737 A * | 5/1999 | Trabucco | ............ | H01L 21/4853 257/738 |
| 5,984,165 A * | 11/1999 | Inoue | ................... | B23K 1/0056 219/209 |
| 6,204,490 B1 * | 3/2001 | Soga | ................... | B23K 1/0056 219/678 |
| 6,833,526 B2 * | 12/2004 | Sinkunas | ............... | H05K 3/363 219/121.66 |
| 7,239,484 B2 * | 7/2007 | Yamaguchi | .......... | G11B 5/4853 360/234.5 |
| 8,857,700 B2 * | 10/2014 | Jackson | ............... | F16L 58/181 228/199 |
| 2004/0026383 A1 * | 2/2004 | Zakel | ................ | B23K 26/1476 219/121.6 |
| 2004/0050905 A1 * | 3/2004 | Endo | .................... | B23K 1/0056 228/101 |
| 2006/0169750 A1 * | 8/2006 | Tanaka | ................. | B23K 3/0623 228/205 |
| 2007/0045256 A1 * | 3/2007 | Kurahashi | ............ | G02B 6/4249 219/121.73 |
| 2007/0050158 A1 * | 3/2007 | Fukunaka | ............. | G06F 30/367 702/57 |
| 2008/0053970 A1 * | 3/2008 | Nakamae | ............... | H05K 3/3494 219/121.61 |
| 2008/0061111 A1 * | 3/2008 | Kiriyama | ............... | H01L 31/188 228/47.1 |
| 2009/0114625 A1 * | 5/2009 | Palmquist | ........... | B23K 1/0056 219/121.64 |
| 2009/0136725 A1 * | 5/2009 | Shimokawa | ........... | H05K 3/108 428/209 |
| 2009/0142607 A1 * | 6/2009 | Narui | ...................... | B32B 15/08 428/458 |
| 2009/0211786 A1 * | 8/2009 | Bamba | ................... | H05K 3/067 174/250 |
| 2009/0266589 A1 * | 10/2009 | Shimokawa | ............. | H05K 3/26 174/256 |
| 2009/0289039 A1 * | 11/2009 | Takahashi | .............. | B23K 3/082 219/85.12 |
| 2010/0006553 A1 * | 1/2010 | Hsu | ...................... | B23K 1/0016 219/148 |
| 2010/0170940 A1 * | 7/2010 | Leicht | ..................... | B23K 1/015 228/256 |
| 2010/0230142 A1 * | 9/2010 | Bamba | ................... | H05K 3/0055 174/255 |
| 2011/0163085 A1 * | 7/2011 | Kalmbach | ............ | B23K 1/0016 219/616 |
| 2011/0230411 A1 * | 9/2011 | Zussman | ............... | A61K 9/0087 514/15.2 |
| 2012/0228363 A1 * | 9/2012 | Risch | ..................... | H01L 31/188 228/103 |
| 2013/0199771 A1 * | 8/2013 | Yamaguchi | ............ | H05K 3/022 165/185 |
| 2013/0270230 A1 * | 10/2013 | Cheung | ................... | H01L 24/75 219/121.6 |
| 2014/0023847 A1 * | 1/2014 | Kochiyama | ............ | C08G 73/10 428/220 |
| 2016/0053055 A1 * | 2/2016 | Hung | ....................... | B32B 15/08 428/336 |
| 2018/0130683 A1 * | 5/2018 | Hendriks | .......... | H01L 21/67356 |
| 2018/0141163 A1 * | 5/2018 | Wendt | ............... | H01L 21/67144 |
| 2019/0027461 A1 * | 1/2019 | Arutinov | ............. | H05K 3/3494 |

FOREIGN PATENT DOCUMENTS

| | | | | |
|---|---|---|---|---|
| JP | 03124368 A | * | 5/1991 | |
| JP | 2015192104 A | * | 11/2015 | ............. H01L 24/81 |
| KR | 10-2013-0117682 A | | 10/2013 | |
| WO | WO-2016175653 A2 | * | 11/2016 | ............. H01L 24/75 |
| WO | WO-2016175654 A3 | * | 1/2017 | ......... H01L 21/6835 |

OTHER PUBLICATIONS

Ende et al. "Photonic Flash Sodlering of Thin Chips and SMD Components on Foils for Flexible Electronics" pp. 1879-1886, Nov. 2014.*

(56) References Cited

OTHER PUBLICATIONS

Machine translation of JP-2015192104A (no date available).*
Machine translation of JP-62101040-A (no date available).*
Ende et al. "Photonic Flash Soldering of Thin Chips and SMD Components on Foils for Flexible Electronics" pp. 1879-1886, Nov. 2014.*
European Patent Office, International Search Report in corresponding International Application No. PCT/NL2017/050504 dated Sep. 15, 2017 (3 pages).
South Korean Patent Office, Notice of Preliminary Rejection in corresponding South Korean Patent Application No. 10-2019-7005498 dated Oct. 27, 2021.

* cited by examiner

METHOD AND SYSTEM FOR BONDING A CHIP TO A SUBSTRATE

CROSS-REFERENCE TO RELATED APPLICATIONS

This patent application is a U.S. National Phase of PCT International Application No. PCT/NL2017/050504, filed Jul. 25, 2017, which claims priority to European Application No. 16181184.9, filed Jul. 26, 2016, which are both expressly incorporated by reference in their entireties, including any references contained therein.

FIELD AND BACKGROUND

The present disclosure relates to a method and system for bonding a chip to a substrate by means of a heat bonding material disposed there between, e.g. by solder or adhesive material.

In the current market there is an increasing need for low-cost flexible electronic devices. For example, an electronic device may comprise a flexible substrate with electric wiring or tracks wherein one or more chips are bonded to the tracks.

One method to bond a chip to a substrate is reflow oven. For example, the circuit is maintained above the liquidus temperature of a solder between the chip and substrate. Often this can be a time-consuming process. Furthermore, methods such as reflow soldering, conducting adhesive bonding or face-up chip integration may be incompatible with certain foils such as for instance certain low-cost foils (e.g. flexible polyester) having low damage temperatures. For example a polymer substrate may have a glass transition temperature (Tg) around 150 degrees Celsius while an industry standard SAC solder temperature can be in the range of 215 to 250 degrees Celsius. In such cases, a prolonged exposure to elevated temperatures may cause damage to the substrate, i.e. losing essential functionality such as deformation or degradation of a flexible foil and/or degradation of its organic surface coatings or adhesives.

Another method to bond a chip to a substrate is IR/Laser bonding connections are formed by heating the bonding material with IR/Laser spots having a relatively small illumination area. Although laser spot soldering is feasible, the small spot area requires precise positioning of the spot for each component. Furthermore, applying IR/Laser soldering in a roll-to-roll (R2R) process may be more complex and/or challenging as the laser spot needs to be aligned with respect to a moving substrate. Typically, IR/Laser soldering can be quite complex and expensive compared to other soldering methods.

Yet another method to bond a chip to a substrate is photonic heat bonding such as photonic soldering wherein a relatively high energy light pulse is generated from a flash lamp for heat bonding of a heat bonding material, e.g. solder material, thermal adhesive, etc., arranged between a component and a substrate. A chip (or a component such as a silicon based component) can be suitable for absorbing energy exposed on its surface and transfer this energy in the form of heat through the component to heat bonding material joints (e.g. solder joints) for photonic soldering. However, some chips or components may not be suitable for being exposed to the relatively high energy light pulse during photonic soldering. Therefore, in some cases, photonic soldering is limited by a damage temperature of the component/chip.

The inventors find that when the timescale of the heating pulse during photonic heat bonding is sufficiently short such as to avoid significant heating of the substrate, the component can be bonded (e.g. soldered) to the substrate by the heat bonding material there between at temperatures which momentarily reach above the (steady state) damage temperature of the substrate. For example, the total energy of the light pulse may be sufficiently low to avoid significant damage and/or heat is quickly dissipated in the substrate before causing damage. Typically, a high intensity illumination, produced by a flash lamp, may be used to achieve photonic bonding or photonic soldering. However, such a high intensity illumination can be a limiting factor for photonic soldering, due to the relatively low damage temperature of the substrate to which the component/chip needs to be bonded. As a result, some substrates, foils, or strips, to which components/chips need to be bonded by the heat bonding material there between, are not used or avoided in certain thermal bonding methods such as a photonic heat bonding methods because said substrates or foils can become damaged or deteriorate during the photonic bonding process due to the sensitivity to the relatively high energy exposed during the light pulse, which high energy being required for obtaining bonding by means of the heat bonding material.

Consequently, if the exposed energy from the light pulse produced by the flash lamp during photonic heat bonding is too high, not only the chip can be damaged (or undergo deterioration), but additionally or alternatively also the substrate. Furthermore, short light pulses may cause uneven soldering wherein a part of the solder bond adjacent the chip is heated more than a part adjacent the substrate.

SUMMARY

There is a need for a method and a system that obviates at least one of the above mentioned drawbacks. There is a further need to enable photonic heat bonding of a component on a substrate, with solder material arranged there between for a wide range of substrates, in particular polymer based substrates having a relatively low damage temperature. There is a further need to reduce the risk of damaging a component, substrate, and/or solder bond when applying photonic heat bonding for bonding said component to the substrate with a heat bonding material there between.

Accordingly, a first aspect of the present disclosure provides a method for bonding a chip to a substrate by means of heat bonding material disposed there between. The heat bonding material has material properties which cause it to form a bond when its temperature is elevated to a bonding temperature. The method comprises pre-heating at least the substrate from an initial temperature to an elevated temperature remaining below a damage temperature of the substrate; and applying a light pulse to the chip to momentarily increase the temperature of the chip to a pulsed peak temperature remaining below a peak damage temperature of the chip. The momentarily increased pulsed peak temperature of the chip causes a flow of conducted heat from the chip to the bonding material, wherein the conducted heat causes the bonding material to reach the bonding temperature to form a bond between the chip and the substrate.

During photonic heat bonding, such as photonic soldering, a light pulse is generated and the energy is absorbed by a component or chip, wherein the light pulse can result in a brief transient variation of the temperature in at least the chip. If sufficient energy is generated by the light pulse, the chip will warm up and transfer heat to the conductive tracks of a substrate. This heat can cause the heat bonding material which is disposed between the chip and substrate to heat up for bonding and/or forming a connection between the chip and the tracks of the substrate. Energy from the light pulse is therefore transferred through the chip during photonic soldering. The heat bonding material can e.g. be a solder material or solder paste, wherein the bonding temperature is a solder temperature. However, the heat bonding material can also be a thermal adhesive. Other heat sensitive heat bonding materials can also be employed.

Advantageously, as a result of pre-heating from an initial temperature to an elevated temperature, the heat flow from the bond to the substrate at the elevated temperature can be relatively low compared to a situation wherein the substrate would have the initial temperature.

In an advantageous embodiment, the flow of conducted heat from the chip at least partially dissipates before reaching the substrate such that any further temperature elevation in the substrate caused by remaining heat flow via the bond to the substrate keeps the substrate below its damage temperature.

A packaged component or chip being relatively bulky (e.g. LED) can require high intensity illumination to overcome extensive heat drain to a substrate for being able to properly solder the component over the target substrate. Furthermore, such a direct flash lamp illumination of a LED component can destroy a protective polymer matrix of the LED. The substrate can be a metal substrate or comprise one or more metals. The substrate or conductive track may comprise a material with a high heat conduction. This may result in a heat drain through the heat bonding material (e.g. solder material) arranged between the chip and substrate when a light pulse is produced during photonic soldering. As described herein, a chip or component can be soldered to a substrate by pre-heating of at least the substrate to an elevated temperature so as to be able to melt/sinter solder material for soldering with reduced intensity or energy output of a light pulse of a flash lamp during photonic soldering. As a result, the pre-heated substrate can act less as a heat drain during photonic soldering. By pre-heating the substrate, the temperature of the solder material can also increase since the substrate is connected with the chip with solder material there between. The pre-heating of (at least) the substrate to the elevated temperature can thus reduce the heat drain to the substrate during soldering. In this way, damage to the substrate or deterioration of the substrate may be prevented and/or a better soldering may be achieved while reducing a risk for damage or deterioration to the substrate during photonic soldering. Additionally or alternatively, the risk of damaging the chip or the heat bonding material can be reduced. As a result, a heat bonding process such as soldering can be enabled by reducing the heat drain. By employing a same photonic heat bonding light pulse (e.g. having a same light pulse profile or light pulse energy) more heat can be kept within a heat bonding joint of heat bonding material, which may be required for achieving photonic heat bonding of the heat bonding material, e.g. soldering of solder paste.

Heat energy can flow through the chip/component to the heat bonding material. If a same goal temperature needs to be reached for achieving photonic soldering, the starting point (initial temperature or room temperature) can be shifted more towards the target temperature by applying pre-heating. Thus, pre-heating at least the substrate can result in less heat drain from a chip to the conductive tracks (e.g. metal, silver, copper, printed conductors, etc.) of the substrate through the heat bonding material, during a light pulse. The heat drain can take place while requiring less pulse energy and/or take place relatively fast (e.g. shorter than 5 ms). The size of the conductive tracks of the substrate can at least in part determine the heat drain.

In an embodiment, the substrate has a damage temperature, which causes damage to the substrate when applied, e.g. when applied for longer than one second. The substrate can also have a peak damage temperature which can cause damage if applied for a relatively short period of time (e.g. less than 100 ms). Other elements (chip and heat bonding material) can also have a respective damage temperature and peak damage temperature.

During photonic soldering, energy is transferred from the light pulse in a relatively short time (pulse) to at least the chip/component. A "damage temperature" can be considered as a steady state damage temperature which may be a glass transition temperature of a substrate (e.g. polymer substrate) or a steady state damage temperature of the chip/component. A distinction can be made between a relatively slow process of "steady-state" pre-heating followed by a relatively fast process of soldering by a light pulse which causes a "transient" (temporary) temperature peak (pulsed temperature). A "damage temperature" may be defined as a temperature which causes the device to lose essential functionality when applied over a prolonged period of time e.g. for more than one second (like in an oven). A (transient) "pulsed peak temperature" can be defined as a temporary temperature increase staying above the "damage temperature" for less than a relatively short period of time, such as less than hundred milliseconds (as caused by the short light pulse during photonic soldering).

In an example, the substrate is flexible. Such flexible foils can be used advantageously in roll-to-roll processing. In this way, the production efficiency for electronic strips (e.g. LED strips) can be improved using low-cost flexible foils such as PET or PEN.

Advantageously, using the method of the invention, various micro-electronic components or chips sensitive for direct heat illumination by photonic soldering can be effectively soldered onto low-cost low-Tg flexible substrates with conventional leadfree SAC solders. Other substrate materials (e.g. comprising PI, PET, PU-laminated PET, etc., foils, e.g. with Cu) and solders or alloys for soldering (e.g. SAC solder, ICA, etc.) can also be employed.

Additionally or alternatively, the use of low-temperature solder pastes as an alternative for soldering chips on substrates can be avoided, since such pastes may be more expensive and also less established in the industry.

Optionally, a minimum elevated temperature is determined by the lowest elevated temperature from which the temperature of the chip can be momentarily increased by a light pulse for forming a bond by means of the heat bonding material without damaging at least one of the chip or substrate, the lowest elevated temperature being higher than the initial temperature, and wherein a maximum elevated temperature is determined by a lowest damage temperature of the chip or substrate, wherein the elevated temperature is between the minimum elevated temperature and the maximum elevated temperature.

In an embodiment, the pre-heating temperature is at least 10° C. below the (steady state) damage temperature of the substrate, e.g. between 20° C. and 100° C. below the damage temperature of the substrate. This damage temperature of the substrate can be defined by a glass transition temperature of the substrate. The substrate can have a peak damage temperature above the damage temperature. The peak damage temperature causes damage to the substrate even when applied for a short period of time, e.g. shorter than 100 ms. The peak damage temperature of the substrate can be defined by an evaporation or disintegration temperature of the substrate.

In an embodiment, the flow of conducted heat from the chip to the substrate causes a transient heating of the substrate remaining below a (transient) peak damage temperature of the substrate. Optionally, the flow of conducted heat from the chip to the substrate causes a transient heating of the substrate remaining above a steady state damage temperature of the substrate for less than 100 ms. In an example, preferably less than 20 ms, more preferably less than 10 ms or even remaining completely below the (steady state) damage temperature of the substrate.

Optionally, the elevated temperature is at least 50° C.

The elevated temperature is higher than the initial temperature. The initial temperature can correspond to a room temperature, for example being around 20° C. In an embodiment, the elevated temperature is preferably at least 80° C., more preferably at least 100° C. In this way, the risk of damaging and/or deteriorating at least one of the chip or substrate can be reduced, while being able to heat bonding the heat bonding material arranged between the chip and substrate to form a connection through heat bonding. The pre-heating to the elevated temperature is chosen with respect to the substrate, chip and solder material and their properties.

Optionally, the elevated temperature is in a range of 0.5 to 50% degrees Celsius smaller than the lowest damage temperature of the chip or substrate, preferably 0.5 to 30%, more preferably 1 to 20% and most preferably 1 to 10%.

By selecting an elevated temperature near a lowest damage temperature of the damage temperatures of the chip and substrate, damage can be prevented while obtaining a bond as the bonding material reaches the bonding temperature.

Optionally, a damage temperature of the chip is higher than a damage temperature of the substrate.

In an embodiment the photonic heat bonding is obtained by a light pulse coming from a flash light, wherein the light pulse is directed to the chip. Heat can transfer from the chip to the conductive tracks of the substrate, while also heating up the heat bonding material disposed between the chip and the substrate. Naturally, as a consequence of the light pulse, the temperature of the chip, heat bonding material and the substrate change as a function of time (warming up). Since the energy from the light pulse is received by the chip, the induced increased temperature of the chip can be higher than the increased temperature of the substrate. In an example, the damage temperature of the chip is higher than the damage temperature of the substrate so that risk of damaging the chip or substrate during photonic heat bonding can be reduced.

Optionally, the bonding temperature is between the damage temperatures of the chip and the damage temperature of the substrate, respectively.

Optionally, a mask is arranged over a portion of the substrate for at least partly blocking the light pulse from reaching at least a portion of the substrate.

In an embodiment, a shielding, cover or mask can be arranged so that the substrate is less exposed to the light pulse, so as to reduce heat absorption by the substrate as a result of a light pulse of a flash lamp. In this way adjacent components and features can be protected. In an embodiment, the chip can be heated more selectively by using a substrate and chip with different absorption of light.

Optionally, the pre-heating is performed continuously.

By using a continuous pre-heater (such as continuous NIR), it is possible to reduce the heat drain and limit the needed energy generated by the light pulse during photonic heat bonding. By performing a continuous pre-heating, the final push for heat bonding (e.g. soldering solder material) can be provided by the light pulse. Typically, the light pulse can cause a relatively high energy transfer, but the duration of the flash can be relatively small (milliseconds). In an embodiment, as a result of pre-heating the power can be reduced to provide the final push to achieve soldering, while the pulse length (duration of the light pulse) can be kept substantially constant. Other solutions are also possible wherein other parameters of the light pulse are changed.

Optionally, a pre-heater, being arranged for pre-heating at least the substrate, and a light source, being arranged for providing a light pulse for heat bonding, are arranged on opposite sides of the substrate.

In an embodiment, pre-heating at least the substrate is performed at least prior to photonic soldering using a pre-heater. As a result the temperature is increased to an elevated temperature below a damage threshold temperature of at least the substrate such that the heat drain to the substrate is reduced during photonic soldering. Pre-heating can for example be achieved by a hot plate or NIR. Other heaters can also be employed. In an example, the flash lamp used for photonic soldering can be used as a pre-heater. For example, one or more flashes (sequence) can be used wherein each pulse results in gradual increase of the temperature. For example, consecutive flashes generated by the flash lamp can increase the temperature to an elevated temperature. Other solutions such as the use of IR lamps are also possible.

The substrate can be pre-heated in a relatively short period of time by using a pre-heater such as a hot plate or NIR, which may also reduce the duration of the heat bonding process compared to other methods, for example other soldering methods such as oven reflow soldering (e.g. from tens of minutes to seconds). In an embodiment, the method can be configured to imitate reflow profiles using light pulses and pre-heating during photonic soldering.

Optionally, the substrate is flexible and the method is carried out using roll-to-roll processing, wherein during the roll-to-roll processing first the pre-heating is performed followed by the photonic heat bonding of the chip to the substrate.

In case of photonic heat bonding, a relatively large area of illumination from a flash lamp may cancel out the restrictions regarding alignment of the light source with the respect to specific locations having heat bonding material, such as solder material, on the substrate and thus makes the process compatible with R2R processes. The method according to the current invention can thus be well suited with substrates in a R2R setting. In this way, low-cost flexible substrates or foils can be employed, potentially reducing costs and/or increasing production capacities.

Although relatively simple flexible systems, e.g. logic functions with transistors or optoelectronic devices, can be fully printed, in a hybrid approach, flexible circuitry is combined with chips such as integrated circuits (e.g. silicon-based), surface mount device (SMD) components, or light emitting diode (LED) packages. Substrates for flexible electronics may be formed e.g. by copper clad polyimide (PI) foils or polyester foils with copper or printed conductors. In this way, for example, flexible LED strips comprising LED packages soldered on the flexible substrate can be obtained.

The invention can be advantageously used with low-cost foils such as polyethylene terephthalate (PET) and polyethylene naphthalate (PEN) which may be employed for reducing the production costs of packages soldered on flexible substrates. A polyester foil such as polyethylene terephthalate (PET) has a maximum processing temperature of around 120° C. to 150° C., which is much lower than the liquidus temperature of many known industry standard lead-free alloys (typically larger than 200° C.) such as Sn—Ag—Cu (SAC), and therefore may be inappropriate for use in reflow soldering.

Optionally, the flow of conducted heat from the chip to the substrate causes a pulsed heating of the substrate, wherein the temperature of the chip and/or substrate remains above a damage temperature of the chip and/or substrate for less than 100 ms, respectively.

For a relatively short period of time, the temperature of the chip or substrate can be increased above its damage temperature without causing damage to the chip or substrate. However, there exists also a peak damage temperature for the chip and substrate, wherein increase of the temperature above said pulsed peak damage temperature can cause damage or deterioration, even for short period of times (e.g. less than 100 ms). In an example, the substrate has a lower damage temperature than the chip, so that the damage temperature of the substrate is the lowest one of the damage temperatures of the chip and substrate. The pulsed heating of the chip will result in an increase of the temperature of the substrate as a result of heat transfer. For a relatively short period of time, preferably less than 100 ms, the temperature of the substrate can become higher than the damage temperature of the substrate without causing damage or deterioration to the substrate. For this, the increased temperature of the substrate must stay under a pulsed peak damage temperature of the substrate. A similar reasoning is applicable for the chip.

In an advantageous embodiment, the pulsed peak temperature of the chip and/or substrate, caused by the light pulse during photonic heat bonding, is smaller than a peak damage temperature of the chip and/or the substrate, respectively. In this way, further risk of damage or deterioration of the chip and/or substrate can be prevented.

Preheating is typically performed at a relatively low rate of energy transfer compared to a radiant flux of the light pulse used for bonding. For example the amount of energy per unit of time deposited in the substrate and/or chip is lower during preheating than during the light pulse, e.g. lower by a factor of at least two, ten, hundred, or more. Furthermore, preheating at relatively low rate of energy transfer may be typically sustained for a longer period of time than a duration of the pulse, e.g. longer by a factor of at least two, ten, hundred, or more.

In some embodiments, the pre-heating is performed by electromagnetic radiation, e.g. infrared. For example, the pre-heater may comprise a radiation source operating at a specific wavelength range which may thus be different wavelength from that of the light pulse (e.g. originating from a flash lamp). The wavelengths can be characterized for example by the peak of the radiation and/or a spectral range. When using a separate pre-heater, wavelengths used for pre-heating may typically be larger than wavelengths emitted during a light pulse. For example, the pre-heating can be performed by a pre-heater with a spectral range of 0.75 to 10 µm. A near-infrared (NIR) pre-heater may have a spectral range of 0.75 to 1.4 µm. Advantageously, the light pulse provides a short-duration high-energetic radiation relative to the pre-heating radiation. Typically, the amount of energy per unit time impinging the during pre-heating is lower than the flow during the light pulse.

In some embodiments, the pre-heating is performed separately from the light pulse for bonding. For example, the pre-heating may be considered as a separate event, wherein sufficient time such as e.g. more than 0.5 seconds is employed so as to provide sufficient time to spread heat across the arrangement. Optionally, the pre-heating is performed temporally separated from the light pulse, e.g. with no energy transfer in a period between the pre-heating and the light pulse. In this way, the pre-heating can be considered as a separate event, wherein first pre-heating is performed, followed by a light pulse after a certain period of time, such as e.g. 0.5 s, 1 s, 5 s or more. Alternatively, preheating may be a continuous process, e.g. also continue during the light pulse.

In accordance with a second aspect, the invention provides a system for photonic heat bonding of heat bonding material disposed between a chip and a substrate, wherein the heat bonding material has material properties which cause it to form a bond when its temperature is elevated to a bonding temperature, the system comprising: a light source arranged for providing a light pulse for causing the heat bonding material to form a bond at least between the chip and the substrate; and a pre-heater arranged for pre-heating the substrate from an initial temperature to an elevated temperature at least prior to providing the light pulse.

There can be a significant amount of heat drain from the chip through the heat bonding material (e.g. solder), arranged between the chip and a substrate, to conductive tracks of the substrate when the chip is heated up by a light pulse of the flash lamp during photonic heat bonding, wherein the heat drain can result in less effective heat bonding (e.g. soldering). Advantageously, the system comprising a pre-heater can reduce the heat drain, such as to be able to perform photonic heat bonding with a light pulse having a lower intensity while reducing the risk for causing damage or deterioration to at least one of the chip or substrate.

Optionally, the system further comprising a controller arranged for carrying out the steps of: pre-heating at least the substrate from an initial temperature to an elevated temperature remaining below a damage temperature of the substrate; and applying a light pulse to the chip to momentarily increase the temperature of the chip to a pulsed peak temperature remaining below a peak damage temperature of the chip; wherein the momentarily increased pulsed peak temperature of the chip causes a flow of conducted heat from the chip to the bonding material, wherein the conducted heat causes the bonding material to reach the bonding temperature to form a bond between the chip and the substrate.

For achieving a bond by means of the heat bonding material (e.g. soldering of solder paste) a certain bonding temperature needs to be achieved within said heat bonding material (including on the interface with the chip and conductive tracks of the substrate). As a result of localized heat transfer in the vicinity of the heat bonding material, meaning that the substrate only warms up locally, and the relatively short light pulse, damage to the substrate can be prevented.

In an example, the chip comprises a LED. Some components such as LEDs may comprise features being sensitive to high temperatures. The system and method as described herein may allow photonic heat bonding (e.g. soldering) of LEDs onto a substrate, while reducing the risk of damage and/or deterioration to said LEDs. Other chips and components are also possible, such as for example silicon chips, SMD components, etcetera.

In accordance with another aspect, the invention provides a computer program product downloadable from a communication network and/or stored on a computer-readable and/or microprocessor-executable medium, comprising program code instructions that, when executed by a photonic heat bonding system including a processor, causes the system to perform a method as described herein.

The invention further relates to a substrate comprising a soldered chip obtained according to the method of the invention.

BRIEF DESCRIPTION OF THE DRAWINGS

The invention will further be elucidated by description of some specific embodiments thereof, making reference to the attached drawings. The exemplary embodiments are given by way of non-limitative illustration. The detailed description provides examples of possible implementations of the invention, but is not to be regarded as describing the only embodiments falling under the scope. The scope of the invention is defined in the claims, and the description is to be regarded as illustrative without being restrictive on the invention.

In the drawings.

DETAILED DESCRIPTION

Figure 1:
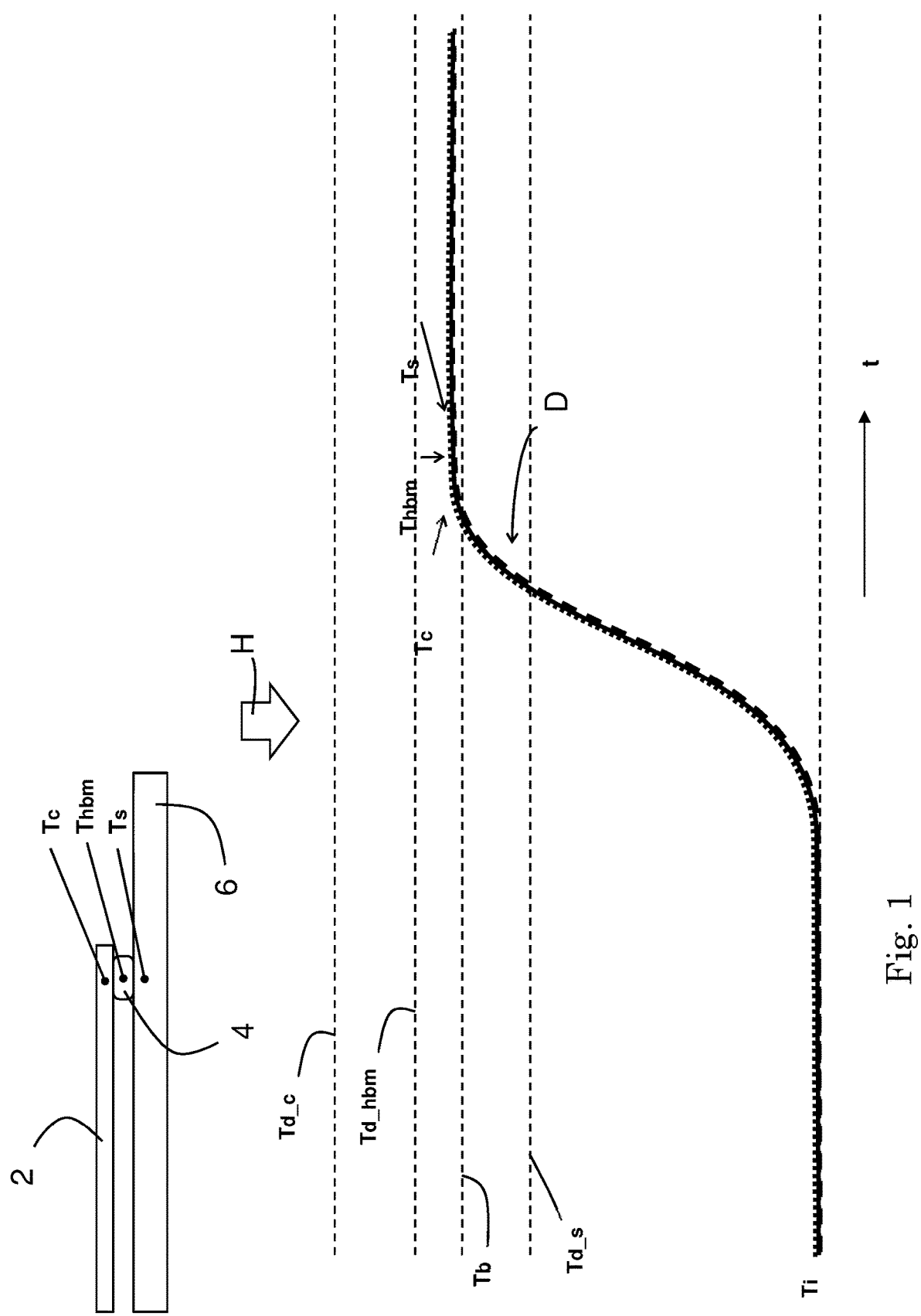
FIG. 1 schematically illustrates temperature profiles for different probing positions during reflow soldering in a reflow oven.

FIG. 1 schematically illustrates temperature profiles plotted for different probing positions during reflow soldering in a reflow oven.

The probing positions for the temperature are indicated in a schematic illustration of a chip 2 and substrate 6 with heat bonding material 4 disposed there between. Only one heat bonding material 4 joint is shown, however, the chip can be connected with a substrate by means of a plurality of heat bonding material 4 joints. In this example, the heat bonding material 4 is a solder 4, however, other materials can also be used as the heat bonding material 4, such as thermal adhesives or other materials being able to form a bond when a bonding temperature is reached and/or maintained for long enough. The plotted temperatures Tc, Thbm and Ts give an indication of the temperature of the chip, heat bonding material and substrate as a function of time, respectively.

Initially, the temperature of the elements, namely the chip 2, the heat bonding material 4 and the substrate 6 are at an initial temperature Ti. This temperature can for instance be a room temperature Ti. By placing the elements in a reflow oven and start heating H and thus increasing the temperature in the oven, the temperature of the elements can be increased gradually until heat bonding can be obtained by the heat bonding material 4. For this purpose, a bonding temperature Tb of the heat bonding material 4 is reached. Moreover, sufficient time can be needed so as to be able to form the bond. In case of soldering, the bonding temperature Tb is a solder bonding temperature of the solder. In this example, the solder bonding temperature Tb is higher than a damage temperature of the substrate Td_s. This temperature Td_s can cause irreversible damage (loss of essential functionality) or deterioration to the substrate 6 when maintained long enough. For example, Td_s may be a glass transition temperature of a polymer substrate, or a melting or disintegration temperature of the substrate and/or one or more constituents forming the substrate. This is typically the case in reflow soldering wherein the elements are heated up for typically relatively long periods of time (one or more seconds up to several minutes, or even longer). Also a damage temperature of the heat bonding material Td_hbm is provided, which is in this example higher than the increased temperature of the elements in the reflow oven. For a solder, the damage temperature Td_hbm can correspond to a solder outgassing temperature for the solder 4. Further, in this example, a damage temperature Td_c of the chip 2 is above the increased temperature of the elements in the reflow oven, required for obtaining a soldering bond by the solder 4, i.e. above the solder bonding temperature Tb.

Therefore, in this example, the substrate can become damaged D once the temperature of the substrate Ts is increased above the substrate damage temperature Td_s and maintained above this temperature for a sufficiently long period of time (e.g. more than 1 second). The temperatures and time resulting in damage or deterioration of the substrate depends on i.a. on the material properties of the substrate. Also the geometrical properties can be of importance, such as the thickness of the substrate. In the shown example of reflow soldering in FIG. 1, the damage temperature Td_s of the substrate 6 is exceeded long enough in the oven, so that the substrate 6 becomes damaged D as a result of the prolonged heating in the oven. Typically, there is little or no difference in the progress of the temperature Tc, Thbm, Ts, as a function of time t for the different elements (chip 2, heat bonding material 4, substrate 6) being warmed up in the oven. The temperatures of the chip 2, heat bonding material 4 and substrate 6 all increase at the same rate to reach a solder bonding temperature Tb.

Consequently, the use of a reflow oven for soldering a chip 2 to a substrate 6 may not be useful when the damage temperature of the chip 2 and/or substrate 6 is below the solder bonding temperature Tb, as there is no way to heat the heat bonding material 4 independent of the chip 2 and the substrate 6.

Figure 2:
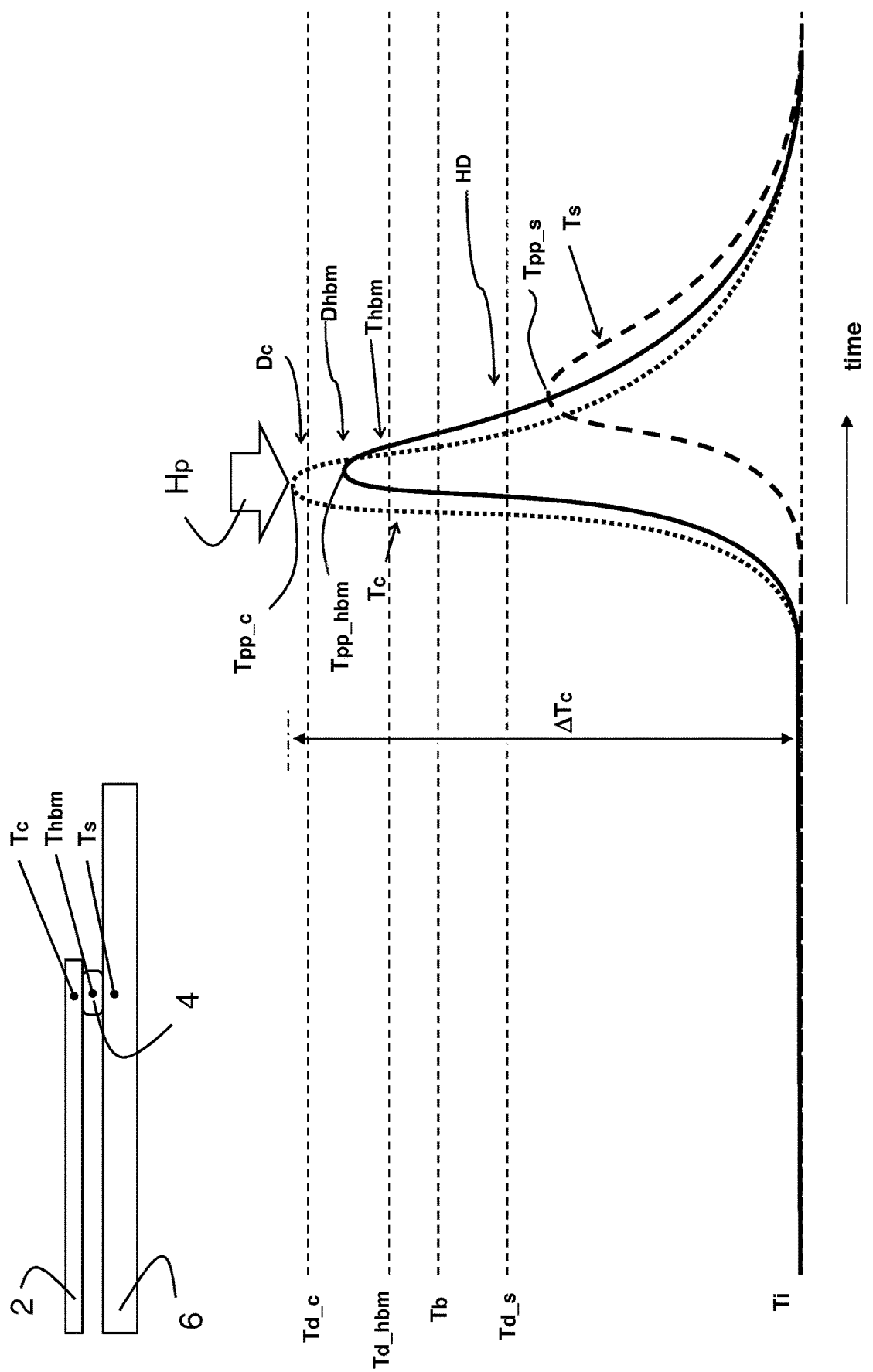
FIG. 2 schematically illustrates temperature profiles during photonic heat bonding.

FIG. 2 schematically illustrates temperature profiles during photonic heat bonding, such as photonic heat soldering. A relatively high energy light pulse is employed with pulse-only heating. Again, temperatures Tc, Thbm, and Ts are shown as a function of time for the chip 2, the heat bonding material 4 and the substrate 6, respectively. The temperature may be averaged over an area or volume of the respective elements of the system (chip 2, solder 4, substrate 6) since temperature differences may exist in an element at a certain time due to the transient nature of a light pulse. Such a light pulse can generate heat Hp and cause pulsed peak temperatures in the elements. This transient phenomenon can cause a difference in the progress of the temperature as a function of time for the different elements (chip 2, heat bonding material 4, substrate 6). As a result of the photonic light pulse, the chip 2 will warm up resulting in a transient peak of the temperature of the chip Tc. As a result of the heat transfer from the chip 2 to the heat bonding material (e.g. solder), also the temperature of the heat bonding material will show a peak as a function of time. There may exist a time delay as shown in FIG. 2. The momentarily increased pulsed peak temperature Tpp_c of the chip 2 causes a flow of conducted heat from the chip 2 to the bonding material 4, wherein the conducted heat causes the bonding material 4 to reach a temperature equal to or higher than the bonding temperature Tb to form a bond between the chip 2 and the substrate 6. As a result of the heating of the chip and the heat bonding material 4, also the substrate 6 can heat up, with a pulsed peak temperature Tpp_s remaining below a damage temperature Td_s of the substrate 6. Although the pulsed peak temperature Tpp_c of the chip 2 increases to a value above the damage temperature Td_c of the chip 2, the chip 2 may not be damaged because of the relatively short time period in which the temperature Tc is maintained above the damage temperature Td_c of the chip 2. The chip 2 can become damaged if the pulsed peak temperature 2 is above a peak damage temperature Tpd_c of the chip 2 (not shown). In some cases, the temperature difference ΔTc of the chip 2 from an initial temperature Ti to the pulsed peak temperature Tpp_c of the chip 2 can result in damage of the chip 2 and/or the substrate 6, because during the light pulse the temperature of the chip 2 or substrate 6 is increased above a peak damage temperature Tpd_c of the chip 2 or a peak damage temperature Tpd_s of the substrate 6 (not shown).

There is a significant amount of heat drain HD from the chip 2 through the heat bonding material 4 to conductive tracks of the substrate 6 when the chip 2 is heated up by a light pulse during photonic heat bonding. The heat drain can result in less effective soldering during photonic soldering.

Consequently, by employing photonic soldering, the above-mentioned problem regarding the use of reflow oven can be solved because the substrate temperature Ts can remain below the solder bonding temperature Tb. However, another problem can occur relating to the fact that while the solder 4 is being heated by the chip 2, the heat at the solder 4 can be drained to the relatively cold substrate. Therefore, so as to be able to still achieve a sufficient soldering temperature Tb, the chip 2 may have to be heated more and to such a degree that it causes damage to the chip 2.

In some cases, using photonic soldering, a lowest pulsed peak temperature is needed for causing a heat bonding material to form a soldering bond by applying the light pulse. However, applying the light pulse to the chip to momentarily increase the temperature of the chip from the initial temperature to the minimum transient peak temperature damages at least one of the chip or substrate.

Figure 3:
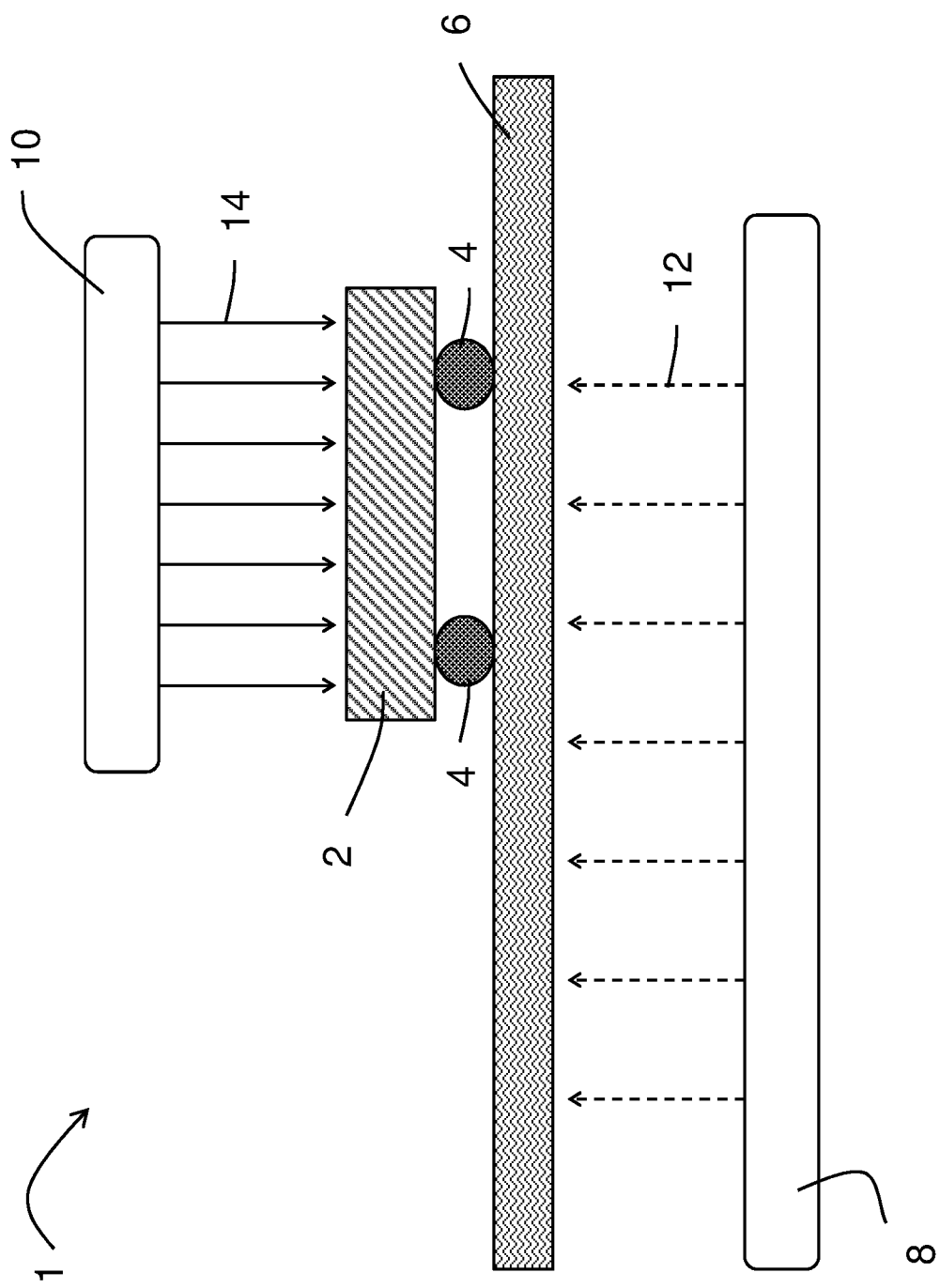
FIG. 3 schematically illustrates a system of the present invention.

FIG. 3 schematically illustrates a system 1 of the present invention. In the shown embodiment, the system 1 for soldering solder material 4 disposed between the chip 4 and the substrate 6 comprises a light source 10 (e.g. flash lamp) arranged for providing a light pulse 14 for soldering of solder material 4 and a pre-heater 8 arranged for pre-heating 12 the substrate 6 from an initial temperature Ti to an elevated temperature T2 at least prior to providing the light pulse 14. The system 1 can further comprise a controller (not shown) arranged for carrying out the steps of: pre-heating the substrate 6 from an initial temperature Ti to an elevated temperature Te; applying a light pulse 14 to the chip 2 to momentarily increase the temperature Tc of the chip 2 from the elevated temperature Te to a pulsed peak temperature Tpp_c. The momentarily increased transient pulsed peak temperature Tpp_c of the chip 2 causes the solder material 4 to form a soldering bond between the chip 2 and the substrate 6 by a conducted heat pulse of the chip 2 to the solder material 4. The chip 2 and/or substrate 6 can have a damage temperature Td_c, Td_s between the elevated temperature Te and the pulsed peak temperature Tpp.

Prior to photonic soldering, a solder material 4 or solder paste 4 can be deposited on substrate bond pads and a chip 2 can be placed on the substrate 6. Subsequently, a relatively high-intensity light pulse 14 generated from a flash lamp 10 can be used to illuminate the chip 2 and the surrounding substrate 6. In an embodiment, the heating rate can be controlled by the flashing frequency and pulse duration and intensity. The heated chip 2 can transfer heat to the solder material 4 which has been deposited at the bond pads, forming a bond.

Sufficient thermal energy must be transferred from the tracks and chip 4 to the solder material 4 (or solder paste) to activate and drive out the flow and melt the solder material so as to be able to make a solder connection. The solder connection between the chip 2 and substrate 6 is thus achieved by melting/sintering solder material 4 between the chip 2 and the substrate 6 using a light pulse 14, wherein at least the substrate 6 is pre-heated at least prior to the light pulse 14 such that the heat drain HD to the substrate 6 can be reduced during the photonic soldering. Pre-heating of the substrate 6 to a elevated temperature Te has an advantage of reducing the heat drain to the substrate during photonic soldering. In a relatively short time period (pulse) light is emitted with a radiant energy large enough for soldering of the solder material 4, while damage to the substrate 6 is prevented by reducing the heat drain during said short time period.

The light pulse 14 should be long enough for the soldering process to occur, i.e. transition from a non-soldered to a soldered state. Typically, once soldering is achieved, the solder material 4 can obtain a higher thermal conductivity. If for example soldering is achieved after a period of time (e.g. in 5 ms), it may be possible to continue providing heat energy to the chip 2 without damaging the chip 2, since the heat energy may be conducted through the chip 2 and through the solder material 4 to the conductive tracks of the substrate 6 more easily.

In the shown embodiment, the pre-heater 8 and flash lamp 10 are arranged on opposite sides of the substrate 6. In an other exemplary embodiment, if the substrate 6 is at least partially transparent to the spectrum of the light source, the assembly can be illuminated from a back side. A pre-heater 8 such as a NIR source 8 can be used during photonic heat bonding a chip 2 to a substrate 6 wherein the heat drain HD is reduced by selectively pre-heating at least the substrate 6.

Figure 4:
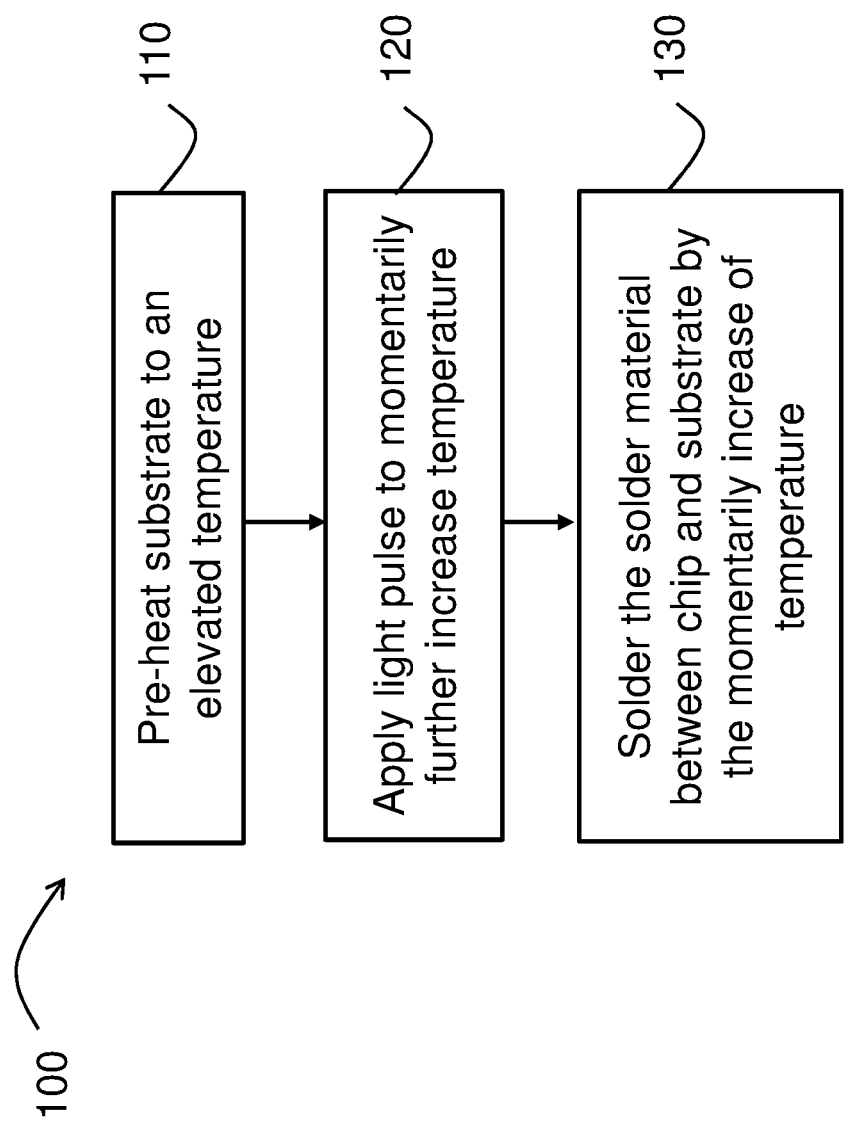
FIG. 4 schematically illustrates a method of the present invention.

FIG. 4 schematically illustrates a method 100 of the present invention. The method 100 for soldering a chip to a substrate, comprises providing a solder material 4 between the chip 2 and the substrate 6, pre-heating 110 the substrate 6 from an initial temperature Ti to a steady state elevated temperature Te, and applying 120 a light pulse 14 to the chip 2 to momentarily increase the temperature of the chip 2 from the elevated temperature Te to a (transient) pulsed peak temperature Tpp_c. The momentarily increased pulsed peak temperature Tpp_c of the chip 2 causes the heat bonding material 4 such as solder material 4 to form 130 a (soldering) bond between the chip 2 and the substrate 6 by a conducted heat pulse of the chip 2 to the heat bonding soldering material 4. The chip 2 and/or substrate 6 have a damage temperature Td_c, Td_s between the elevated temperature Te and the pulsed peak temperature of the chip Tpp_c or the substrate Tpp_s, respectively.

Photonic soldering wherein at least the substrate is pre-heated can reduce the heat drain and thus lower the energy flow or flow required to heat up a chip locally and eventually solder the chip onto the substrate. Advantageously, the method can also be used for soldering a chip or component to low-temperature flexible substrates/foils. The substrate can be heated up by a pre-heater to the temperature close to but slightly lower than a damage temperature Te or glass transition temperature Tg of a material of the substrate. Executing photonic soldering under such conditions is more effective, as now the chip 2 only needs to selectively heated up from a starting temperature (elevated temperate Te) close to the damage temperature Td_s of the substrate or glass transition temperature (e.g. Tg≈150° C.) to a (transient) pulsed peak temperature required for soldering (e.g. Tpp≈250° C.), while in the former case temperature jump is from the initial temperature Ti or room temperature (Ti≈20° C.) to the pulsed peak temperature (e.g. 250° C.). In this way, the heat drain HD from the chip 2 to the substrate 6 or conductive tracks of the substrate 6 via the solder material 4 there between can be significantly reduced, which allows the chip 2 to be soldered without significant damage and/or significant deterioration of the chip 2 and/or substrate 6.

Figure 5:
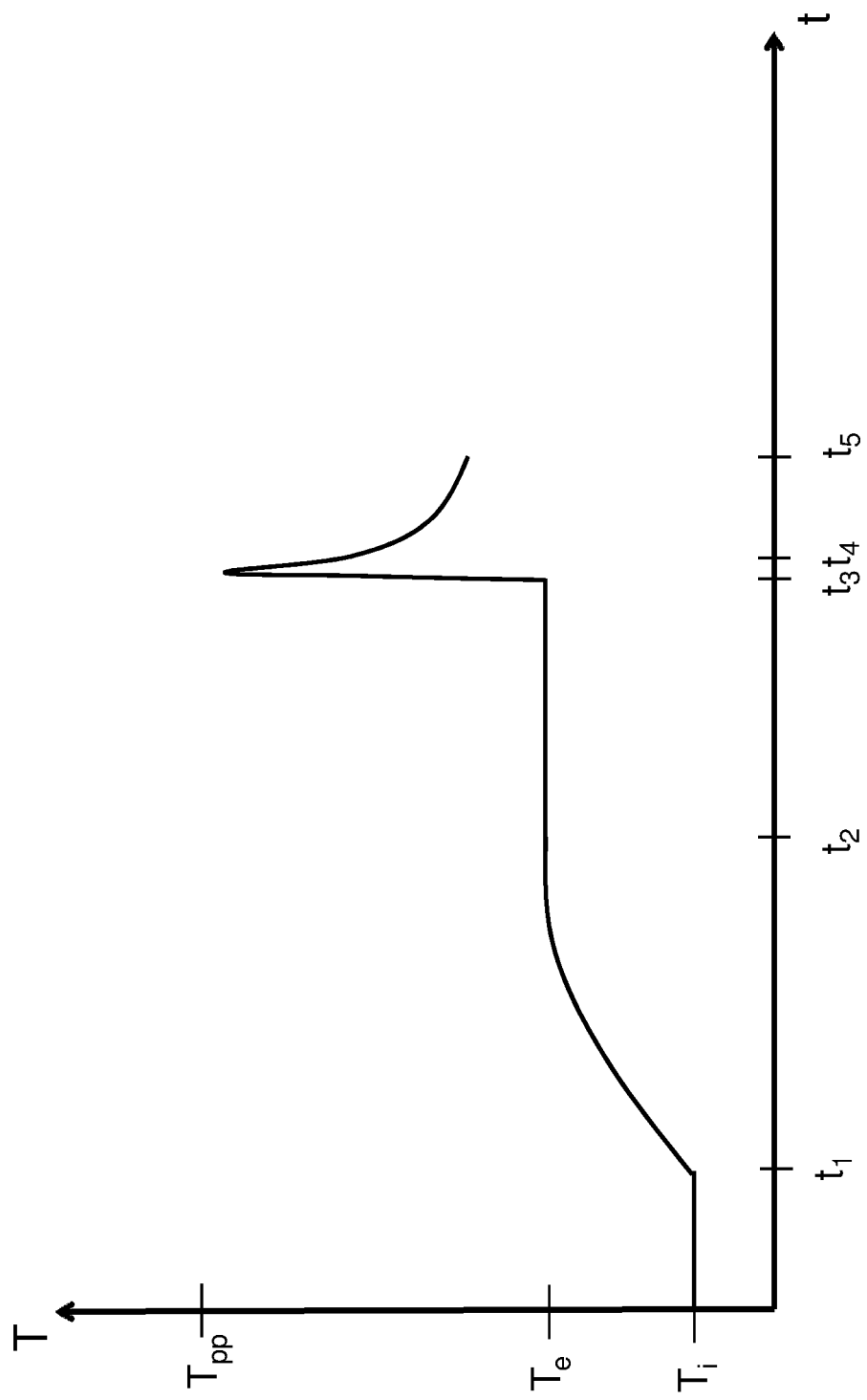
FIG. 5 schematically illustrates a temperature profile.

FIG. 5 schematically illustrates a plotted temperature profile graph. During pre-heating, at least the substrate 6 is heated at time step t1 from an initial temperature Ti to an elevated temperature Te. In this example, a steady state elevated temperature is reached at time step t2. A light pulse 14 is applied at time step t3 directed to at least the chip 2 to momentarily increase the temperature of the chip 2 from the steady state elevated temperature Te to a transient pulsed peak temperature Tpp, reached at time step t4. The momentarily increased transient pulsed peak temperature Tpp of the chip 2 causes the solder material 4 to form a soldering bond between the chip 2 and the substrate 6 by a conducted heat pulse of the chip 2 to the solder material 4. The chip 2 and/or substrate 6 have a steady state damage temperature Tg between the steady state elevated temperature Te and the pulsed peak temperature Tpp. As a result of the relative short time of the light pulse 14, the temperature can drop back to a lower temperature, see e.g. time step t5, whereby damage or deterioration to the chip 2 and/or the substrate 6 can be avoided. A similar reasoning can be made if a thermal adhesive 4 is employed instead of a solder paste 4 as the heat bonding material. Other types of heat bonding materials 4 can also be employed.

During photonic soldering, the chip 2 can absorb energy from the light pulse 14 and warm up resulting in an elevation of the temperature of the chip 2 in a certain time interval. If sufficient energy is generated by the light pulse 14 and there is sufficient energy flow, the absorbed energy can be transferred to the solder material 4. Therefore, soldering is achieved by heat transferred from the chip 2 through the solder material 4 to the conductive tracks of the substrate 6. In this way, a soldered connection can be achieved between the chip/component 2 and tracks of the substrate 6. For achieving soldering of the solder material 4, the solder material joint 4 needs to be sufficiently warmed up. However, if too much energy is provided to the chip/component 2, the chip 2 and/or substrate 6 may become damaged or undergo deterioration. Therefore, in order to reduce the threshold energy needed to be sent through the chip/component 2 by the light pulse 14, while still sufficiently generating a heat flow to the solder 4, suitable pre-heating can be applied. The pre-heating 12 as described herein can significantly reduce the heat drain HD to the substrate 6. The heat drain HD resulting in an energy from the chip 2 to the substrate 6 will typically be larger when a cold or non-pre-heated substrate 6 is used. In such a case (no pre-heating), as a consequence of the heat drain, heat bonding material 4 may not be able to form a bond, e.g. the solder material 4 may not be able to melt/sinter such as to form the bond between the chip 2 and the substrate 6.

The elevated temperature Te obtained by pre-heating depends on the elements in the system 1. For example, for a less temperature sensitive substrate 6 such as a polyamide substrate a temperature up to around 200° C. may be used as a pre-heating elevated temperature Te. PET substrates can be considered more temperature sensitive, wherein a temperature up to around 100 to 110° C. can be used as a pre-heating elevated temperature Te. For PET substrates 120° C. can be a decomposition temperature. If such a temperature (or higher) is held for a relatively long time, the substrate 6 can become damaged or deteriorate. Advantageously, the elevated temperature Te obtained by pre-heating, which can be a steady state elevated temperature Te, can be chosen so as to stay below a threshold temperature or decomposition temperature of the used substrate 6 (e.g. 100° C. for PET). For example, if the elevated temperature Te as a result of pre-heating is equal to 100° C. and the pulsed peak temperature Tpp resulting in soldering is equal to 250° C., the jump will be 150° C. while in case of no pre-heating, starting from room temperature (e.g. around 20° C.), the jump will be 230° C., so that a higher energy (e.g. light intensity of the light pulse) can be required for obtaining a heat bonding by the light pulse 14. The temperature difference gradient can be lower and therefore the flow of energy can also be lower by employing pre-heating. In this way, less energy may be needed so that the generated energy by the light pulse can be applied more efficiently for bonding of the heat bonding material 4, i.e. for example soldering the solder material 4.

In an advantageous embodiment, the pulsed peak temperature Tpp is smaller than a peak damage temperature Tpd of the chip 2 (Tpd_c) and/or the substrate 6 (Tpd_s).

Figure 6:
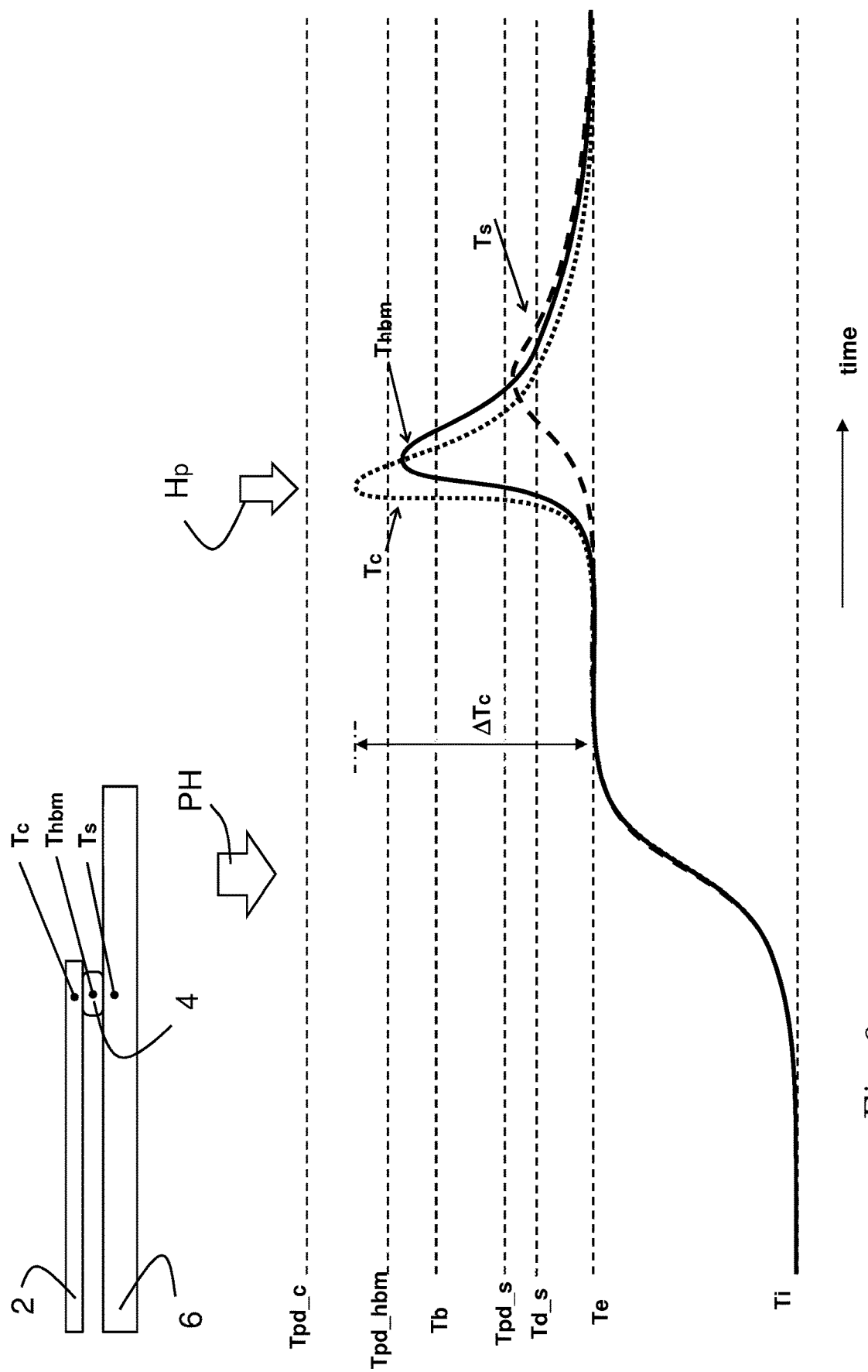
FIG. 6 schematically illustrates temperature profiles during photonic heat bonding with pre-heating.

FIG. 6 schematically illustrates temperature profiles during photonic heat bonding with pre-heating PH of at least the substrate 6 from an initial temperature Ti to an elevated (pre-heat) temperature Te. An elevated steady state temperature Te is obtained after a period of time, e.g. over the course of one or more seconds, wherein the temperature Tc of the chip 2 is increased from this elevated steady state temperature Te to a pulsed peak temperature Tpp_c of the chip 2 by providing a light pulse 14. The light pulse 14 may have a lower intensity (energy) compared to the light pulse 14 shown in FIG. 2 as a result of the pre-heating. In this way the heat drain HD can be reduced, such that risk for damage to the chip 2 and/or substrate 6 as a result of a relatively high energy light pulse 14 can be reduced. The pulsed peak temperatures of the chip (Tpp_c), heat bonding material (Tpp_hbm) and the substrate (Tpp_s) remain below peak damage temperatures of the chip (Tpd), heat bonding material (Tpd_hbm) and the substrate (Tpd_s), respectively, while the elevated temperature Te remains below the damage temperature of the chip (Td_c) and the substrate (Td_s). The pulsed peak temperature Tpp_hbm of the heat bonding material as a result of heat transferred from the chip 2 to the heat bonding material 4 is above the bonding temperature Tb of the heat bonding material such as to form a bond.

In some embodiments, the step of pre-heating the substrate and/or chip may be distinguished from the pulsed heating by the light source by a time-scale wherein the pre-heating is applied. For example, the substrate may be exposed to a pre-heating source such as an infrared lamp or oven for one or more seconds, minutes, or even longer, until it reaches or crosses the elevated temperature Te. Conversely, the pulsed heating by the light source, e.g. flash lamp, is applied over a relatively short time, e.g. applied for less than hundred milliseconds, preferably less than ten milliseconds, e.g. the chip is rapidly heated over the course of two milliseconds as shown in the simulations of FIGS. 7,9-11.

Advantageously, a minimum elevated temperature Te can be determined as the lowest elevated temperature Te from which the temperature Tc of the chip 2 can be momentarily increased by a light pulse 14 for forming a bond by means of the heat bonding material 4 without damaging at least one of the chip 4 or substrate 6. The lowest elevated temperature is higher than the initial temperature Ti. A maximum elevated temperature Te is determined by a lowest one of the damage temperatures of the chip and substrate. The elevated temperature Te can be chosen between the minimum elevated temperature and the maximum elevated temperature.

Consequently, in an embodiment, the above-mentioned problem regarding the use of a reflow oven can be solved when a chip damage temperature Td_c is greater than a solder temperature Tb, which in turn is greater than the substrate damage temperature Ts, which in turn is greater than an elevated temperature Te (a pre-heating temperature). The problem of photonic soldering can be solved by reducing the heat drain to the substrate. Accordingly, a light pulse during photonic soldering can have a lower energy and heat the chip 2 such that a maximum absolute temperature of the chip 2 can be lower compared to the case in FIG. 2. In particular, below a chip damage temperature. Alternatively or additionally, a temperature "shock" or a temperature difference ΔT between an elevated temperature (i.e. pre-heating temperature) and a highest chip temperature can be lower compared to the case in FIG. 2. Alternatively or additionally, the heat energy reaching the substrate 6 can be of a transient nature and not have sufficient time (milliseconds) so as to cause damage to the substrate 6.

Figure 7:
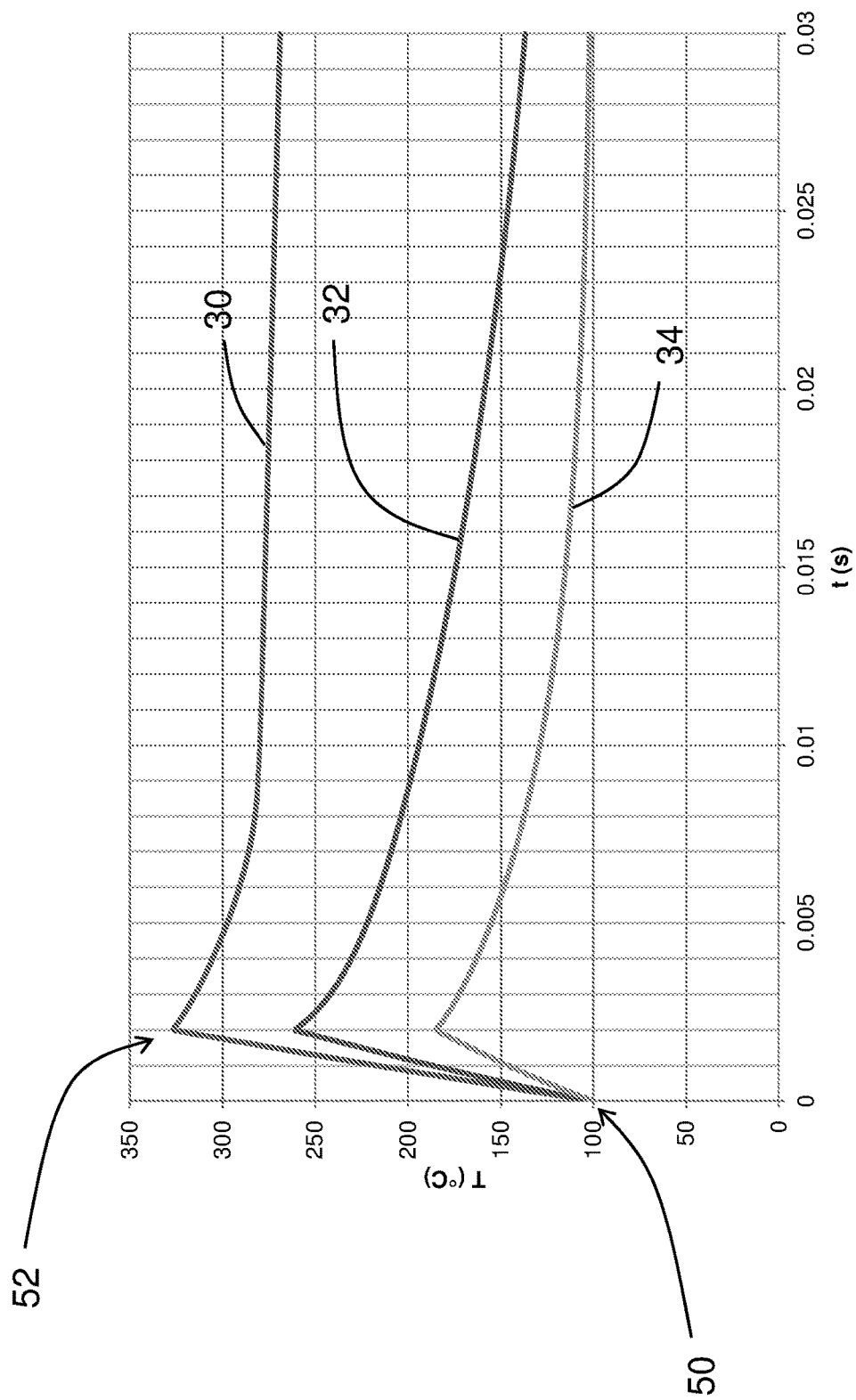
FIG. 7 shows simulated results with temperature profiles with pre-heating at different probing locations.

FIG. 7 shows simulation results with temperature profiles 30, 32, 34 at different probing locations, namely at the chip 2, copper track and the substrate 6, respectively. The elements are pre-heated to an elevated temperature Te of 100° C. at point 50 before starting the photonic heat bonding (in this example photonic soldering). A light pulse 14 is applied resulting in an increase in the temperature of the chip 2, copper track, substrate 6 and the solder material 4 disposed between the chip 2 and substrate 6. The temperature profile of the chip 30 shows a relatively steep increase until reaching a maximum at peak 52. Also the temperature profiles of the copper track 32 and the substrate 34 reach a peak temperature 52 starting from the elevated temperature Te. In this example, a peak temperature 52 is reached as a result of the light pulse 14 in approximately 2 ms. At least the substrate is pre-heated from an initial room temperature Ti to an elevated temperature Te while remaining below a damage temperature Td_s of the substrate. The light pulse can result in a momentarily increase of the temperature of the chip to a pulsed peak temperature Tpp_c remaining below a peak damage temperature of the chip Tpd_c. The momentarily increased pulsed peak temperature Tpp_c of the chip 2 causes a flow of conducted heat from the chip 2 to the bonding material 4, wherein the conducted heat causes the bonding material 4 to reach the bonding temperature to form a bond between the chip 2 and the substrate 6. Consequently, as a result of pre-heating the chip 2 can become soldered to the substrate 6 without damaging the chip 2 and/or the substrate 6.

Figure 8:
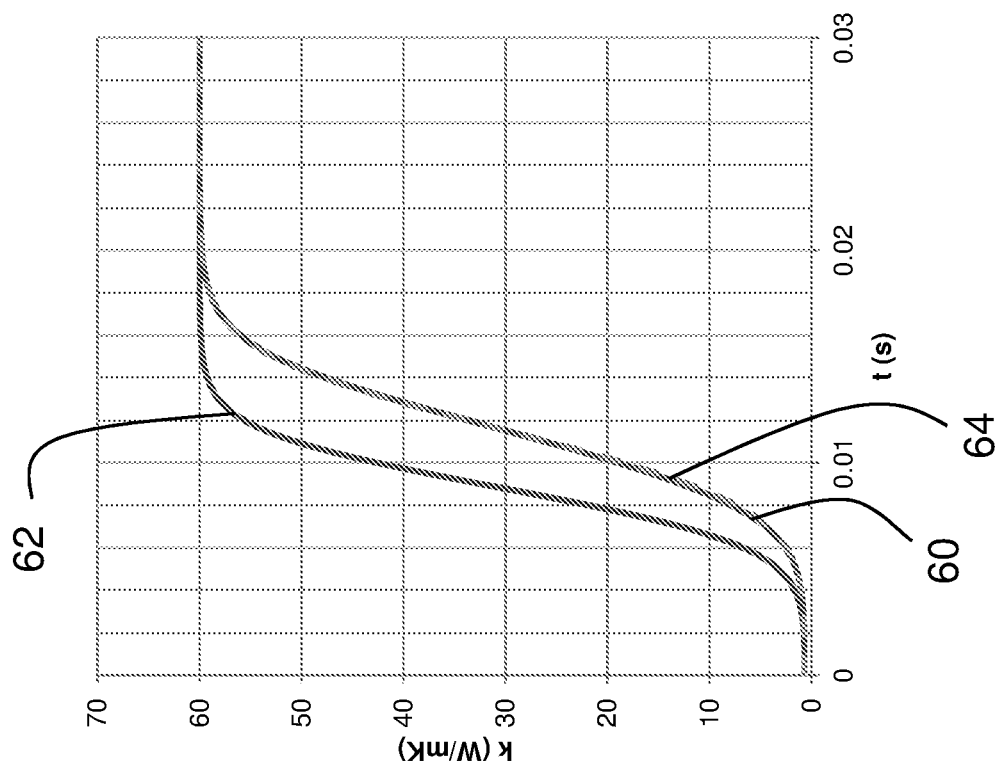
FIG. 8 shows simulated results with the thermal conductivity of the heat bonding material as a function of time during photonic heat bonding.

FIG. 8 shows simulation results with the thermal conductivity of the heat bonding material as a function of time during photonic heat bonding. In this example, the heat bonding material is a solder. Graphs 60, 62, 64 give the thermal conductivity k of the solder 4 as a function of time t for a case without pre-heating and a light pulse of 4.0 J (higher energy), with pre-heating and a light pulse of 2.6 J (lower energy) and with pre-heating and a light pulse of 4.0 J (higher energy), respectively. The graphs 60, 62, 64 can be used to determine whether the solder 4 is soldered thoroughly. In this example, once the plateau of the thermal conductivity k at 60 W/mK is reached, the solder joint 4 becomes substantially soldered. Comparing soldering with and without pre-heating, it can be seen that if no pre-heating is applied the system requires a pulse energy of 4.0 J (higher energy), while using pre-heating to a temperature of 100° C., a same chip and substrate can be soldered with a pulse energy of 2.6 J (lower energy). Also, as indicated by graphs 62 and 64, if pre-heating to 100° C. is employed, the chip 2 and substrate 6 are also soldered using a pulse energy of 4.0 J, however, the soldering is achieved faster than using a pulse energy of 2.6 J.

Figure 9:
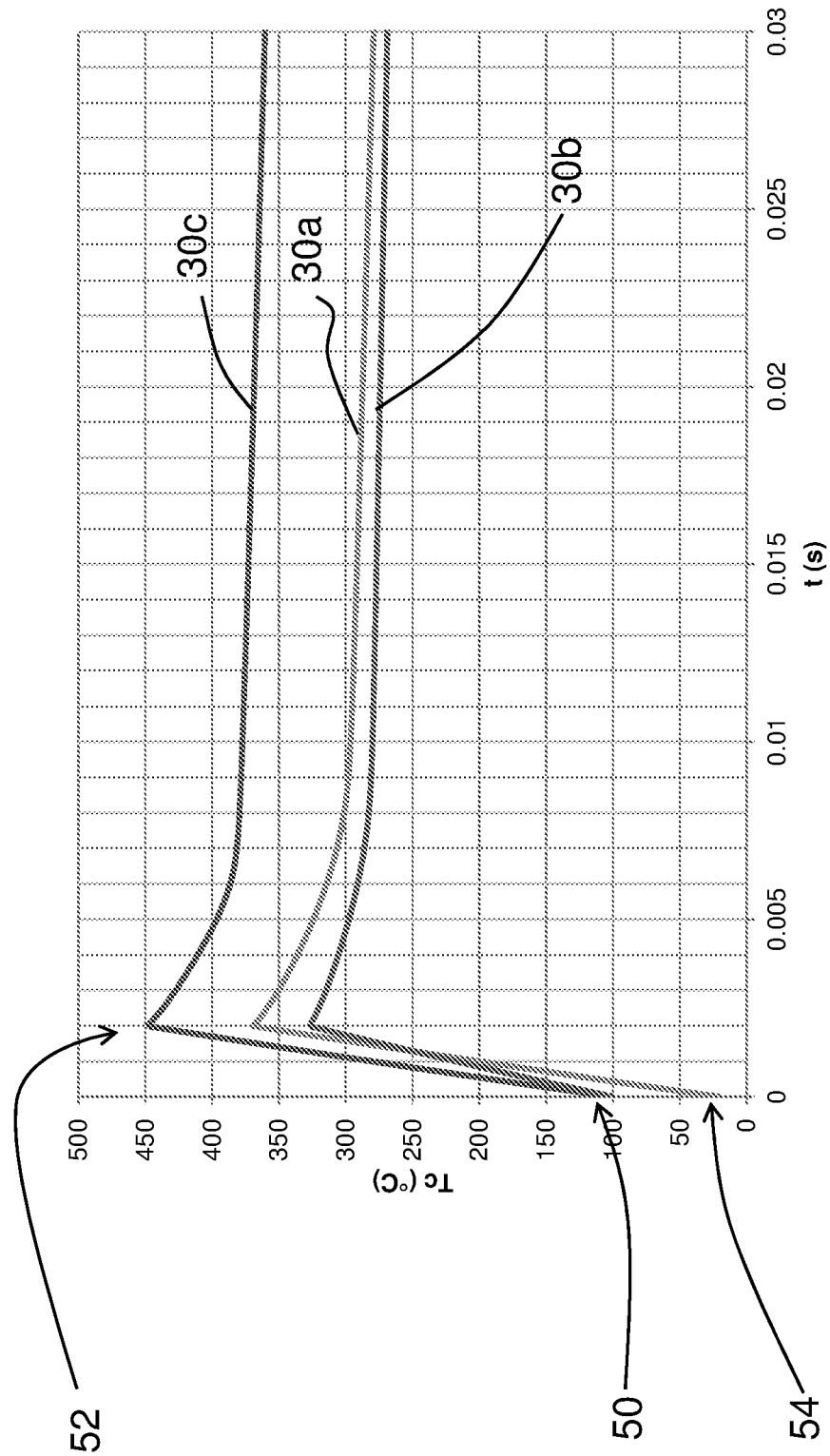
FIG. 9 shows simulated results with temperature profiles in a silicon chip during photonic heat bonding.

FIG. 9 shows simulation results with temperature profiles 30a, 30b, 30c of the chip 2 during photonic heat bonding without pre-heating and a light pulse of 4.0 J, with pre-heating and a light pulse of 2.6 J, and with pre-heating and a light pulse of 4.0 J, respectively. The temperature profile 30a starts from an initial temperature Ti at point 54 corresponding to a room temperature. The temperature profiles 30b and 30c start from an elevated temperature Te equal to 100° C. at point 50 in this example. After approximately 2 ms a peak temperature 52 is reached as a result of the light pulse 14.

Figure 10:
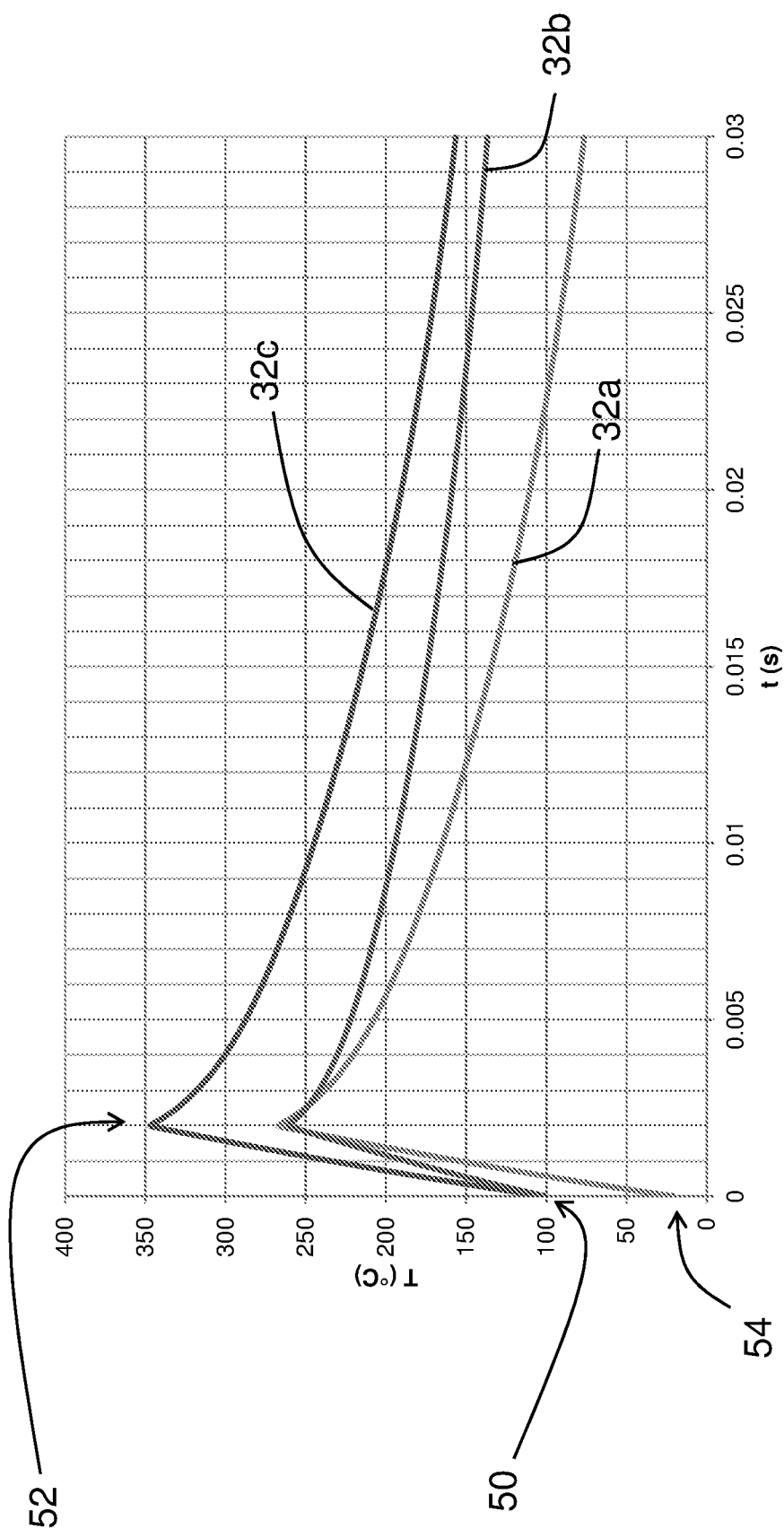
FIG. 10 shows simulated results with temperature profiles in a copper track during photonic heat bonding.

FIG. 10 shows simulation results, similar to FIG. 9, with temperature profiles 32a, 32b, 32c of a copper track during photonic heat bonding without pre-heating and a light pulse of 4.0 J, with pre-heating and a light pulse of 2.6 J, and with pre-heating and a light pulse of 4.0 J, respectively.

Figure 11:
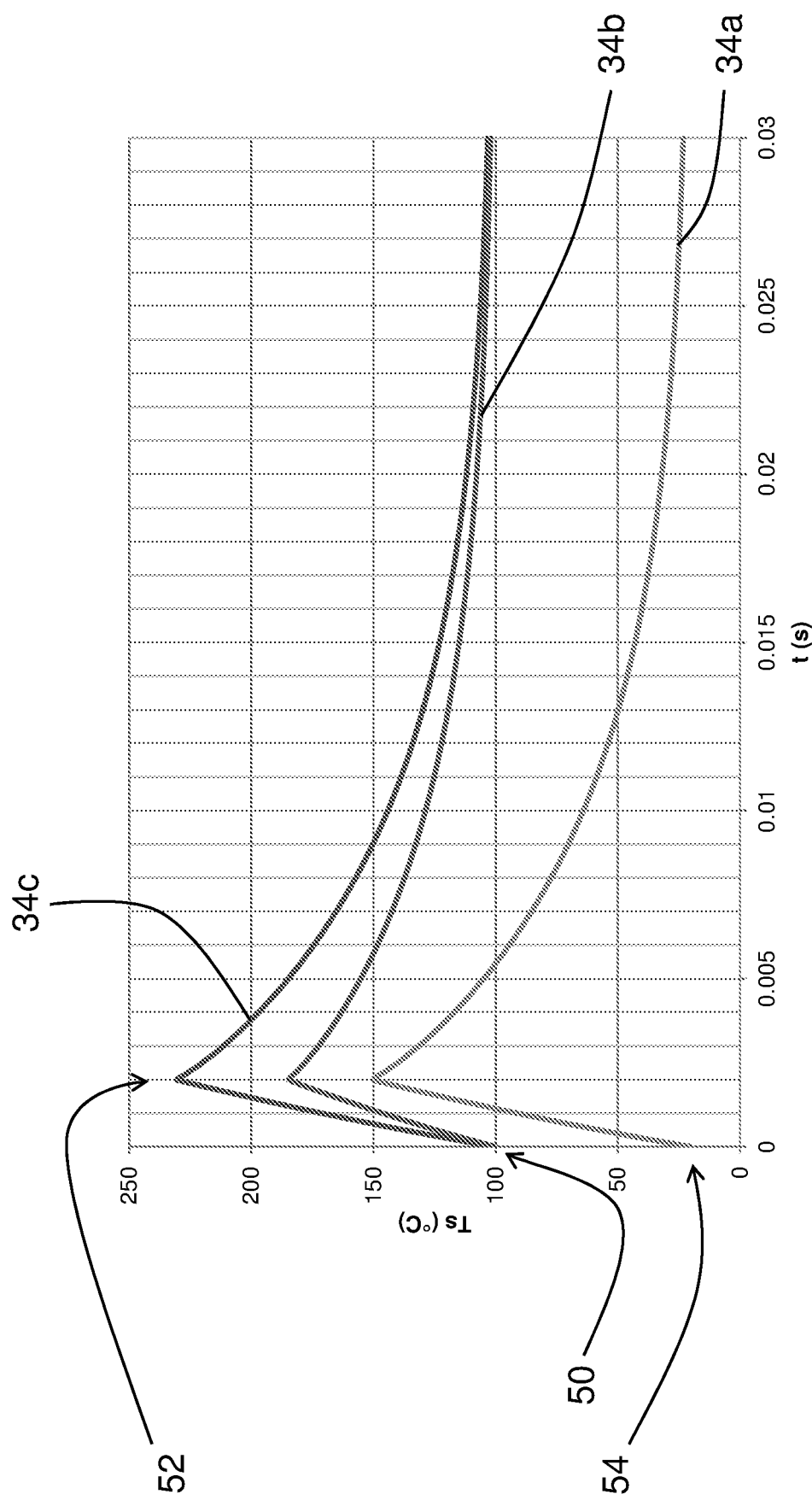
FIG. 11 shows simulated results with temperature profiles in a substrate during photonic heat bonding.

FIG. 11 shows simulation results, similar to FIGS. 9 and 10, with temperature profiles 34a, 34b, 34c of a substrate during photonic heat bonding without pre-heating and a light pulse of 4.0 J, with pre-heating and a light pulse of 2.6 J, and with pre-heating and a light pulse of 4.0 J, respectively. By performing a pre-heating, the heat drain from the chip through the solder to the conductive tracks of the substrate can be decreased, so that the pulse energy can be decreased (e.g. from 4.0 J to 2.6 J), while preventing damage to the substrate and still achieving soldering of the chip 2 to the substrate 6. Advantageously, the energy needed for soldering a chip 2 to a substrate 6 during photonic soldering, i.e. the energy needed to sufficiently heat up the chip 2 by the light pulse 14 so as to transfer sufficient energy to the conductive tracks through solder material 4, such as to form a bond by heat bonding (e.g. soldering), can be reduced, while also reducing the heat drain HD from the chip 2 through the solder material 4 to the conductive tracks. Consequently, a risk of damaging the chip 2 and/or the substrate 6 during photonic soldering can be reduced. Furthermore, as a result of localized heat transfer in the vicinity of the heat bonding material 4, meaning that the substrate 6 only warms up locally, and/or the (extremely) short pulses 14, damage to the substrate 6 can be prevented.

Figure 12:
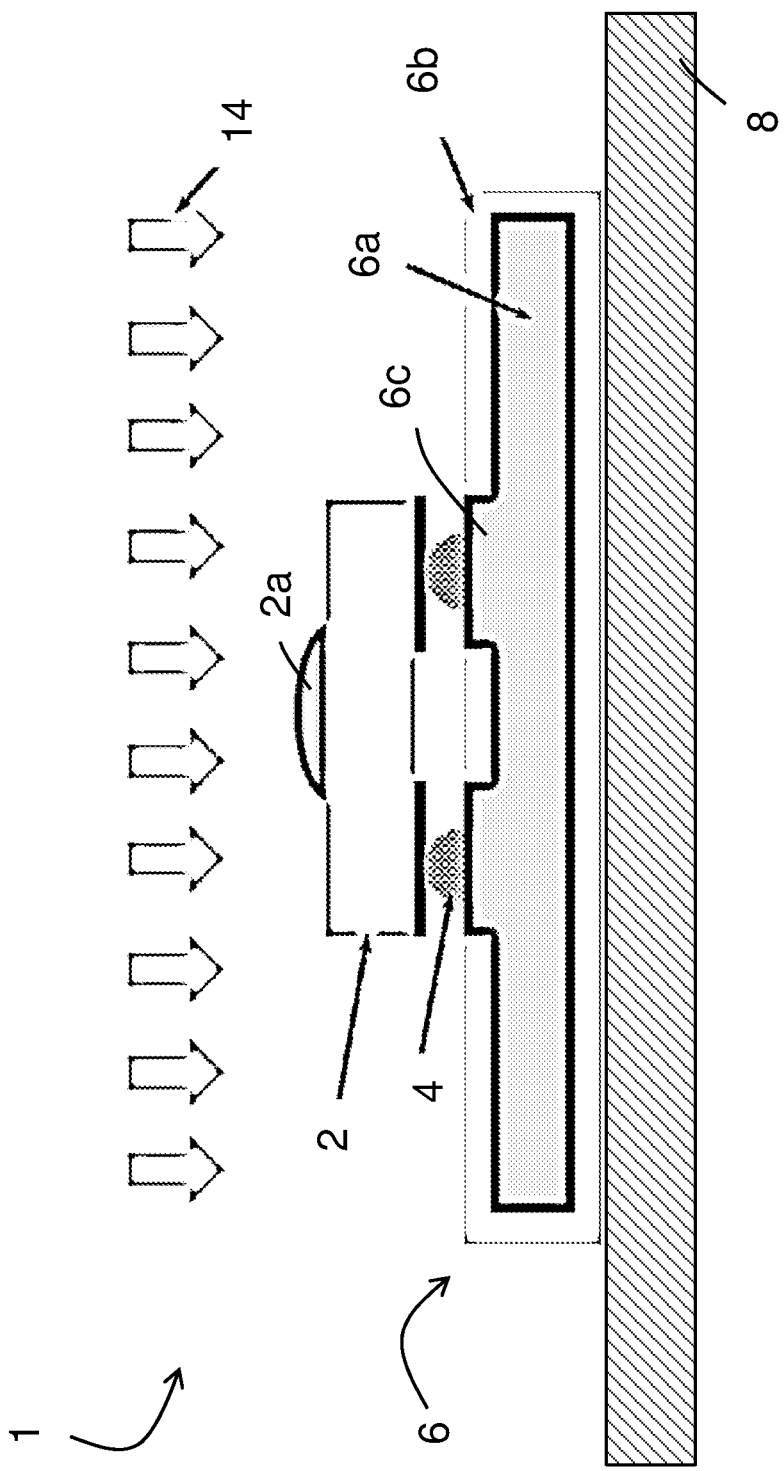
FIG. 12 schematically illustrates a system of the present invention.

FIG. 12 schematically illustrates a system 1 for photonic soldering of a LED on a flexible substrate. The chip 2 is embodied as a LED 2 with a light emitting part 2a. A flash 14 is provided by a flash lamp 10 for photonic soldering. The system 1 is pre-heated by a pre-heater 8 arranged on a bottom side of the substrate 6. The pre-heater can be a hot plate or other means for providing heat energy to the substrate 6 so as to increase the temperature. The substrate 6 comprises an outer flexible foil 6b (e.g. PET, PI, etc.) and an inner metal foil 6a (e.g. Cu) providing conductive tracks 6c. Advantageously, by employing the method as described herein, damage to for instance the light emitting part 2a of the LED and/or the outer flexible foil 6b can be avoided.

Figure 13:
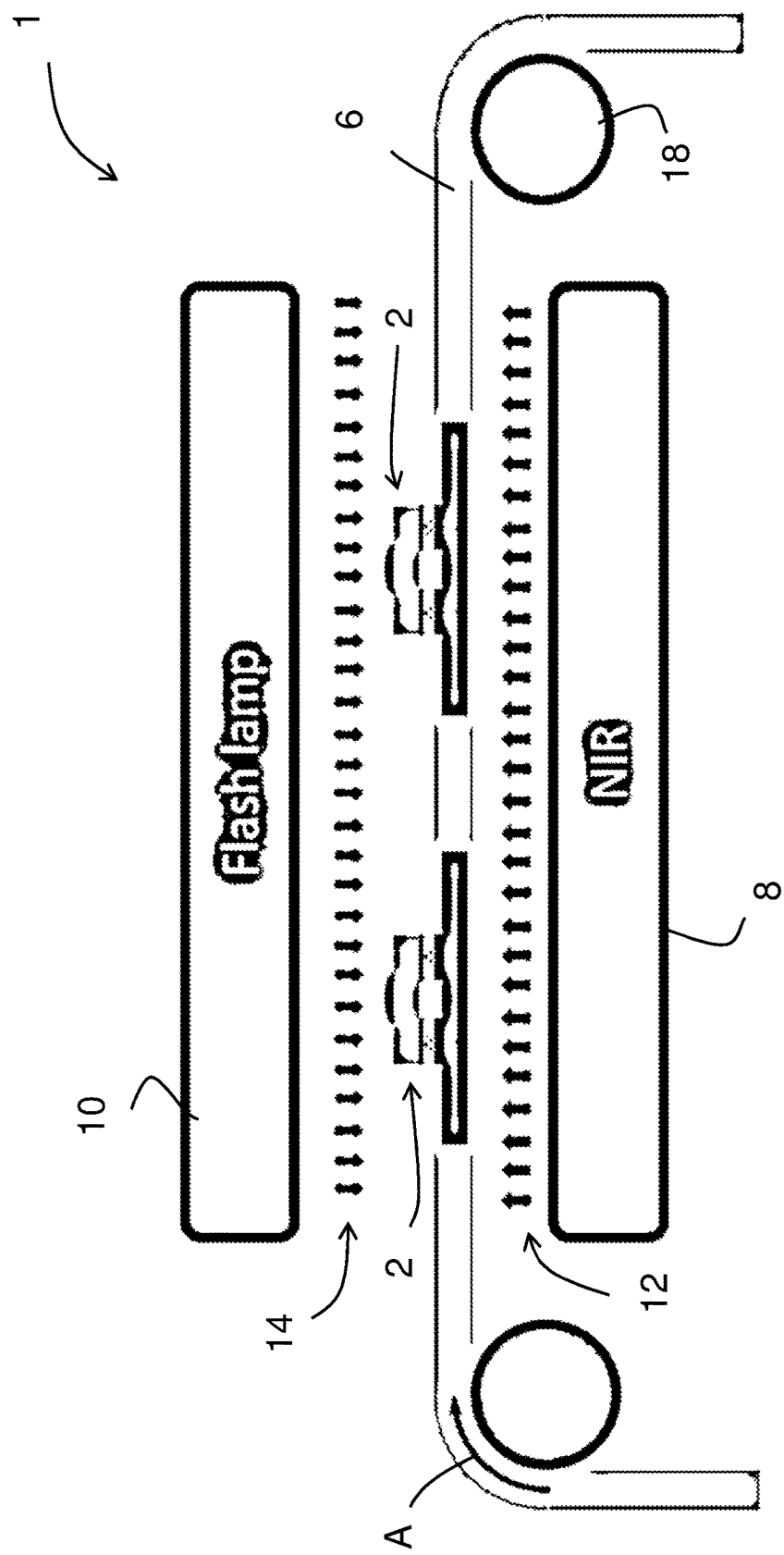
FIG. 13 schematically illustrates a system of the present invention.

FIG. 13 schematically illustrates a system 1 comprising a roll-to-roll (R2R) feed system comprising rollers 18 for moving the substrate 6 and chips in a moving direction A. In this way, higher processing speeds can be achieved for photonic chip soldering. During the R2R soldering of chips 2 (in this example LED modules 2) the substrate 6 is pre-heated by a NIR lamp 8. A conventional hot plate or other pre-heating means can also be used. The flash lamp 10 provides a light pulse 14 for performing the soldering action.

The method and system as described herein can also be used for removing soldered chips/components 2 by employing photonic soldering, while preventing or reducing the risk of damaging the chips/components 2 and/or foils/substrates 6. For instance, the method can be employed for scavenging parts (e.g. recycling) and/or remove faulty chips for replacement or repair. By employing pre-heating the heat drain HD can be effectively reduced, so that a lower light pulse energy can be employed for weakening the soldering connection 4 between the chip/component 2 and the substrate 6 for removal of the chip/component 2 from the foil/substrate 6.

Herein, the invention is described with reference to specific examples of embodiments of the invention. It will, however, be evident that various modifications and changes may be made therein, without departing from the scope which is defined by the claims. For the purpose of clarity and a concise description, features are described herein as part of the same or separate embodiments, however, it will be appreciated that the scope of the invention may include embodiments having combinations of all or some of the features described. Also alternative ways may be envisaged by those skilled in the art having the benefit of the present disclosure for achieving a similar function and result. E.g. the pre-heater may be combined or split up into one or more alternative components. The various elements of the embodiments as discussed and shown offer certain advantages, such as reducing the risk of damaging components, reducing costs, improving production, improving efficiency, etc. Of course, it is to be appreciated that any one of the above embodiments or processes may be combined with one or more other embodiments or processes to provide even further improvements in finding and matching designs and advantages. It is appreciated that this disclosure offers particular advantages to soldering a chip to a substrate, and in general can be applied for any application wherein an element needs to be soldered on a surface.

In the claims, reference signs shall not be construed as limiting the claim. The term "comprising" and "including" when used in this description or the appended claims should not be construed in an exclusive or exhaustive sense but rather in an inclusive sense. Thus the expression "comprising" as used herein does not exclude the presence of other elements or steps in addition to those listed in any claim. Furthermore, the words "a" and "an" shall not be construed as limited to "only one", but instead are used to mean "at least one", and do not exclude a plurality. Features that are not specifically or explicitly described or claimed may be additionally included in the structure of the invention within its scope.

The invention claimed is:

1. A method for bonding a chip to a substrate by a heat bonding material disposed there between, wherein the heat bonding material has material properties which cause the heat bonding material to form a bond when a temperature of the heat bonding material is elevated to a bonding temperature, the method comprising:
   pre-heating, in accordance with a glass transition temperature of the substrate, at least the substrate from an initial temperature to an elevated temperature remaining below the glass transition temperature of the substrate;
   applying, using a flash lamp after the pre-heating the substrate to the elevated temperature, a light pulse to the chip to cause a momentary increase to a temperature of the chip to a pulsed peak temperature;
   wherein the momentary increase to a temperature of the chip to the pulsed peak temperature causes a conducted heat flow from the chip to the heat bonding material,
   wherein the conducted heat flow from the chip to the heat bonding material causes:
      the heat bonding material to reach the bonding temperature for the heat bonding material to form a bond between the chip and the substrate, and
      a pulsed heating of the substrate;
   wherein, as a result of the combined pre-heating and pulsed heating of the substrate, the substrate momentarily reaches a temperature above the glass transition temperature of the substrate for a period of time,
   wherein the period of time is less than 100 ms, and
   wherein, during the preheating, the substrate is raised to the elevated temperature that is in a range of 0.5 to 30% degrees Celsius smaller than the glass transition temperature of the substrate.

2. The method according to claim 1, further comprising:
   determining a minimum elevated temperature by a lowest elevated temperature from which the temperature of the chip can be momentarily increased by the light pulse for forming a bond by the heat bonding material without damaging at least one of the chip or substrate, the lowest elevated temperature being higher than the initial temperature,
   determining a maximum elevated temperature as the glass transition temperature, and
   selecting the elevated temperature between the minimum elevated temperature and the maximum elevated temperature.

3. The method according to claim 2, wherein the elevated temperature is at least 50° C.

4. The method according to claim 3, wherein the elevated temperature is in a range of 1 to 20% degrees Celsius smaller than the glass transition temperature of the substrate.

5. The method according to claim 1, wherein a damage temperature of the chip is higher than the glass transition temperature of the substrate, wherein the damage temperature of the chip is defined as a minimum temperature at which the chip loses essential functionality when maintained over a period of time exceeding one second.

6. The method according to claim 1, wherein the bonding temperature is between the damage temperature of the chip and the glass transition temperature of the substrate.

7. The method according to claim 1, wherein a mask is arranged over a portion of the substrate for at least partly blocking the light pulse from reaching at least a portion of the substrate.

8. The method according to claim 1, wherein the pre-heating is performed continuously.

9. The method according to claim 1, wherein a pre-heater, being arranged for pre-heating at least the substrate, and a light source, being arranged for providing a light pulse for heat bonding, are arranged on opposite sides of the substrate.

10. The method according to claim 1, wherein the substrate is flexible and the method is carried out using roll-to-roll processing, wherein during the roll-to-roll processing, the pre-heating is performed first and is followed by the flash lamp photonic heat bonding of the chip to the substrate.

11. The method according to claim 3, wherein the elevated temperature is in a range of 1 to 10% degrees Celsius smaller than the glass transition temperature of the substrate.

\* \* \* \* \*